(12) United States Patent
Yamazaki et al.

(10) Patent No.: US 9,366,930 B2
(45) Date of Patent: Jun. 14, 2016

(54) DISPLAY DEVICE WITH CAPACITOR ELEMENTS

(75) Inventors: Shunpei Yamazaki, Tokyo (JP); Toru Takayama, Kanagawa (JP); Satoshi Murakami, Tochigi (JP); Hajime Kimura, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 13/367,805

(22) Filed: Feb. 7, 2012

(65) Prior Publication Data

US 2012/0175619 A1 Jul. 12, 2012

Related U.S. Application Data

(62) Division of application No. 11/882,146, filed on Jul. 31, 2007, now Pat. No. 8,120,031, which is a division of application No. 10/437,446, filed on May 14, 2003, now Pat. No. 8,256,421.

(30) Foreign Application Priority Data

May 17, 2002 (JP) ................................. 2002-143711

(51) Int. Cl.
*H01L 29/04* (2006.01)
*H01L 27/01* (2006.01)
(Continued)

(52) U.S. Cl.
CPC ........ *G02F 1/1368* (2013.01); *G02F 1/133305* (2013.01); *G02F 1/136277* (2013.01);
(Continued)

(58) Field of Classification Search
CPC ............ H01L 27/3244; H01L 27/3258; H01L 27/3265; H01L 51/5237

USPC ...................... 257/59, 72, 637, 347
See application file for complete search history.

(56) References Cited

U.S. PATENT DOCUMENTS 3,597,667 A 8/1971 Horn
4,313,782 A 2/1982 Sokoloski
(Continued)

FOREIGN PATENT DOCUMENTS

EP 0 556 484 A1 8/1993
EP 0 603 866 A1 6/1994
(Continued)

OTHER PUBLICATIONS

Okuyama.K et al., "Water-Related Threshold Voltage Instabilitiy of Polysilicon TFTs", IEDM 93: Technical Digest of International Electron Devices Meeting, Dec. 5, 1993, pp. 527-530.
(Continued)

*Primary Examiner* — Ori Nadav
(74) *Attorney, Agent, or Firm* — Nixon Peabody LLP; Jeffrey L. Costellia

(57) ABSTRACT

A structure for preventing deteriorations of a light-emitting device and retaining sufficient capacitor elements (condenser) required by each pixel is provided. A first passivation film, a second metal layer, a flattening film, a barrier film, and a third metal layer are stacked in this order over a transistor. A side face of a first opening provided with the flattening film is covered by the barrier film, a second opening is formed inside the first opening, and a third metal layer is connected to a semiconductor via the first opening and the second opening. A capacitor element that is formed of a lamination of a semiconductor of a transistor, a gate insulating film, a gate electrode, the first passivation film, and the second metal layer is provided.

23 Claims, 17 Drawing Sheets

(51) Int. Cl.

| | | |
|---|---|---|
| *H01L 23/58* | (2006.01) | |
| *G02F 1/1368* | (2006.01) | |
| *H01L 27/32* | (2006.01) | |
| *H01L 51/52* | (2006.01) | |
| *H05B 33/04* | (2006.01) | |
| *G02F 1/1333* | (2006.01) | |
| *G02F 1/1362* | (2006.01) | |

(52) U.S. Cl.
CPC ........ *H01L 27/3244* (2013.01); *H01L 27/3258* (2013.01); *H01L 27/3265* (2013.01); *H01L 51/5237* (2013.01); *H05B 33/04* (2013.01); *H01L 2251/5315* (2013.01)

(56) References Cited

U.S. PATENT DOCUMENTS

| | | |
|---|---|---|
| 4,342,617 A | 8/1982 | Fu et al. |
| 4,347,586 A | 8/1982 | Natsui |
| 4,409,724 A | 10/1983 | Tasch et al. |
| 4,447,272 A | 5/1984 | Saks |
| 4,566,175 A | 1/1986 | Smayling et al. |
| 4,651,406 A | 3/1987 | Shimizu et al. |
| 4,808,845 A | 2/1989 | Suzuki et al. |
| 4,823,180 A | 4/1989 | Wieder et al. |
| 4,851,370 A | 7/1989 | Doklan et al. |
| 4,886,962 A | 12/1989 | Gofuku et al. |
| 4,951,100 A | 8/1990 | Parrillo |
| 5,055,906 A | 10/1991 | Mase et al. |
| 5,063,378 A | 11/1991 | Roach |
| RE33,829 E | 2/1992 | Castleberry |
| 5,102,813 A | 4/1992 | Kobayashi et al. |
| 5,113,511 A | 5/1992 | Nelson et al. |
| 5,142,344 A | 8/1992 | Yamazaki |
| 5,169,792 A | 12/1992 | Katoh et al. |
| 5,182,620 A | 1/1993 | Shimada et al. |
| 5,191,373 A | 3/1993 | Nakano |
| 5,198,685 A | 3/1993 | Kitani et al. |
| 5,212,119 A | 5/1993 | Hah et al. |
| 5,247,289 A | 9/1993 | Matsueda |
| 5,292,675 A | 3/1994 | Codama |
| 5,292,677 A | 3/1994 | Dennison |
| 5,306,651 A | 4/1994 | Masumo et al. |
| 5,308,998 A | 5/1994 | Yamazaki et al. |
| 5,313,076 A | 5/1994 | Yamazaki et al. |
| 5,324,974 A | 6/1994 | Liao |
| 5,343,066 A | 8/1994 | Okamoto et al. |
| 5,359,206 A | 10/1994 | Yamamoto et al. |
| 5,365,079 A | 11/1994 | Kodaira et al. |
| 5,414,278 A | 5/1995 | Kobayashi et al. |
| 5,414,442 A | 5/1995 | Yamazaki et al. |
| 5,424,752 A | 6/1995 | Yamazaki et al. |
| 5,426,315 A | 6/1995 | Pfiester |
| 5,440,163 A | 8/1995 | Ohhashi |
| 5,444,457 A | 8/1995 | Hotto |
| 5,446,562 A | 8/1995 | Sato |
| 5,459,596 A | 10/1995 | Ueda et al. |
| 5,466,617 A | 11/1995 | Shannon |
| 5,468,987 A | 11/1995 | Yamazaki et al. |
| 5,476,802 A | 12/1995 | Yamazaki et al. |
| 5,479,052 A | 12/1995 | Yuuki |
| 5,485,019 A | 1/1996 | Yamazaki et al. |
| 5,497,021 A | 3/1996 | Tada |
| 5,498,562 A | 3/1996 | Dennison et al. |
| 5,499,123 A | 3/1996 | Mikoshiba |
| 5,504,020 A | 4/1996 | Aomori et al. |
| 5,504,029 A | 4/1996 | Murata et al. |
| 5,508,209 A | 4/1996 | Zhang et al. |
| 5,512,779 A | 4/1996 | Noda |
| 5,521,107 A | 5/1996 | Yamazaki et al. |
| 5,523,257 A | 6/1996 | Yamazaki et al. |
| 5,545,577 A | 8/1996 | Tada |
| 5,563,427 A | 10/1996 | Yudasaka et al. |
| 5,576,231 A | 11/1996 | Konuma et al. |
| 5,576,655 A | 11/1996 | Fujihira et al. |
| 5,580,381 A | 12/1996 | Yamagata |
| 5,583,369 A | 12/1996 | Yamazaki et al. |
| 5,585,949 A | 12/1996 | Yamazaki et al. |
| 5,585,951 A | 12/1996 | Noda et al. |
| 5,612,254 A | 3/1997 | Mu et al. |
| 5,619,045 A | 4/1997 | Konuma et al. |
| 5,620,905 A | 4/1997 | Konuma et al. |
| 5,623,157 A | 4/1997 | Miyazaki et al. |
| 5,627,084 A | 5/1997 | Yamazaki et al. |
| 5,635,423 A | 6/1997 | Huang et al. |
| 5,650,338 A | 7/1997 | Yamazaki et al. |
| 5,663,077 A | 9/1997 | Adachi et al. |
| 5,672,900 A | 9/1997 | Konuma et al. |
| 5,674,771 A | 10/1997 | Machida et al. |
| 5,680,147 A | 10/1997 | Yamazaki et al. |
| 5,696,386 A | 12/1997 | Yamazaki |
| 5,706,064 A | 1/1998 | Fukunaga et al. |
| 5,712,495 A | 1/1998 | Suzawa |
| 5,719,065 A | 2/1998 | Takemura et al. |
| 5,721,601 A | 2/1998 | Yamaji et al. |
| 5,729,035 A | 3/1998 | Anma |
| 5,733,797 A | 3/1998 | Yamaha |
| 5,737,049 A | 4/1998 | Shin et al. |
| 5,747,355 A | 5/1998 | Konuma et al. |
| 5,771,110 A | 6/1998 | Hirano et al. |
| 5,781,254 A | 7/1998 | Kim et al. |
| 5,784,073 A | 7/1998 | Yamazaki et al. |
| 5,786,241 A | 7/1998 | Shimada |
| 5,789,762 A | 8/1998 | Koyama et al. |
| 5,804,878 A | 9/1998 | Miyazaki et al. |
| 5,805,252 A | 9/1998 | Shimada et al. |
| 5,808,315 A | 9/1998 | Murakami et al. |
| 5,814,529 A | 9/1998 | Zhang |
| 5,815,226 A | 9/1998 | Yamazaki et al. |
| 5,818,550 A | 10/1998 | Kadota et al. |
| 5,831,284 A | 11/1998 | Park et al. |
| 5,847,410 A | 12/1998 | Nakajima |
| 5,849,611 A | 12/1998 | Yamazaki et al. |
| 5,879,969 A | 3/1999 | Yamazaki et al. |
| 5,880,038 A | 3/1999 | Yamazaki et al. |
| 5,893,623 A | 4/1999 | Muramatsu |
| 5,895,937 A | 4/1999 | Su et al. |
| 5,913,112 A | 6/1999 | Yamazaki et al. |
| 5,917,225 A | 6/1999 | Yamazaki et al. |
| 5,939,731 A | 8/1999 | Yamazaki et al. |
| 5,940,732 A | 8/1999 | Zhang |
| 5,945,711 A | 8/1999 | Takemura et al. |
| 5,946,561 A | 8/1999 | Yamazaki et al. |
| 5,952,708 A | 9/1999 | Yamazaki |
| 5,956,105 A | 9/1999 | Yamazaki et al. |
| 5,962,870 A | 10/1999 | Yamazaki et al. |
| 5,962,872 A | 10/1999 | Zhang et al. |
| 5,982,460 A | 11/1999 | Zhang et al. |
| 5,990,542 A | 11/1999 | Yamazaki |
| 6,001,539 A | 12/1999 | Lyu et al. |
| 6,013,928 A | 1/2000 | Yamazaki et al. |
| 6,031,290 A | 2/2000 | Miyazaki et al. |
| 6,037,712 A | 3/2000 | Codama et al. |
| 6,057,904 A | 5/2000 | Kim et al. |
| 6,069,443 A | 5/2000 | Jones et al. |
| 6,078,316 A | 6/2000 | Page et al. |
| 6,100,954 A | 8/2000 | Kim et al. |
| 6,115,090 A | 9/2000 | Yamazaki |
| 6,124,904 A | 9/2000 | Sato |
| 6,136,624 A | 10/2000 | Kemmochi et al. |
| 6,141,066 A | 10/2000 | Matsushima |
| 6,147,375 A | 11/2000 | Yamazaki et al. |
| 6,150,692 A | 11/2000 | Iwanaga et al. |
| 6,166,414 A | 12/2000 | Miyazaki et al. |
| 6,169,293 B1 | 1/2001 | Yamazaki |
| 6,188,452 B1 | 2/2001 | Kim et al. |
| 6,211,928 B1 | 4/2001 | Oh et al. |
| 6,215,154 B1 | 4/2001 | Ishida et al. |
| 6,229,506 B1 | 5/2001 | Dawson et al. |
| 6,236,106 B1 | 5/2001 | Sato |
| 6,239,470 B1 | 5/2001 | Yamazaki |
| 6,252,297 B1 | 6/2001 | Kemmochi et al. |
| 6,271,066 B1 | 8/2001 | Yamazaki et al. |
| 6,271,543 B1 | 8/2001 | Ohtani et al. |

(56) References Cited

U.S. PATENT DOCUMENTS

| | | |
|---|---|---|
| 6,274,516 B1 | 8/2001 | Kamei et al. |
| 6,274,887 B1 | 8/2001 | Yamazaki et al. |
| 6,294,799 B1 | 9/2001 | Yamazaki et al. |
| 6,303,493 B1 | 10/2001 | Lee |
| 6,306,559 B1 | 10/2001 | Tanamura et al. |
| 6,306,694 B1 | 10/2001 | Yamazaki et al. |
| 6,320,224 B1 | 11/2001 | Zhang |
| 6,330,043 B1 | 12/2001 | Kikkawa et al. |
| 6,335,555 B1 | 1/2002 | Takemura et al. |
| 6,346,718 B1 | 2/2002 | Yamanaka et al. |
| 6,356,318 B1 | 3/2002 | Kawahata |
| 6,372,558 B1 | 4/2002 | Yamanaka et al. |
| 6,392,255 B1 | 5/2002 | Shibata et al. |
| 6,420,200 B1 | 7/2002 | Yamazaki et al. |
| 6,429,053 B1 | 8/2002 | Yamazaki et al. |
| 6,448,612 B1 | 9/2002 | Miyazaki et al. |
| 6,451,636 B1 | 9/2002 | Segawa et al. |
| 6,472,258 B1 | 10/2002 | Adkisson et al. |
| 6,475,836 B1 | 11/2002 | Suzawa et al. |
| 6,476,447 B1 | 11/2002 | Yamazaki et al. |
| 6,492,659 B1 | 12/2002 | Yamazaki et al. |
| 6,495,920 B2 | 12/2002 | Lee |
| 6,501,096 B1 | 12/2002 | Hashimoto et al. |
| 6,512,504 B1 | 1/2003 | Yamauchi et al. |
| 6,514,855 B1 | 2/2003 | Suzuki et al. |
| 6,515,300 B2 | 2/2003 | Boer et al. |
| 6,521,913 B1 | 2/2003 | Murade |
| 6,538,301 B1 | 3/2003 | Yamada et al. |
| 6,542,205 B2 | 4/2003 | Ohtani et al. |
| 6,556,257 B2 | 4/2003 | Ino |
| 6,562,672 B2 | 5/2003 | Yamazaki et al. |
| 6,566,711 B1 | 5/2003 | Yamazaki et al. |
| 6,576,926 B1 | 6/2003 | Yamazaki et al. |
| 6,580,454 B1 | 6/2003 | Perner et al. |
| 6,580,475 B2 | 6/2003 | Yamazaki et al. |
| 6,583,472 B1 | 6/2003 | Shibata et al. |
| 6,593,592 B1 | 7/2003 | Yamazaki et al. |
| 6,593,990 B1 | 7/2003 | Yamazaki |
| 6,599,818 B2 | 7/2003 | Dairiki |
| 6,605,826 B2 | 8/2003 | Yamazaki et al. |
| 6,608,353 B2 | 8/2003 | Miyazaki et al. |
| 6,614,076 B2 | 9/2003 | Kawasaki et al. |
| 6,617,611 B2 | 9/2003 | Hasegawa et al. |
| 6,620,663 B1 | 9/2003 | Sune |
| 6,624,450 B1 | 9/2003 | Yamazaki et al. |
| 6,657,230 B1 | 12/2003 | Murade |
| 6,657,260 B2 | 12/2003 | Yamazaki et al. |
| 6,657,692 B2 | 12/2003 | Shiota |
| 6,664,145 B1 | 12/2003 | Yamazaki et al. |
| 6,664,732 B2 | 12/2003 | Yamazaki et al. |
| 6,677,621 B2 | 1/2004 | Yamazaki et al. |
| 6,680,577 B1 | 1/2004 | Inukai et al. |
| 6,689,492 B1 | 2/2004 | Yamazaki et al. |
| 6,690,031 B1 | 2/2004 | Ohtani et al. |
| 6,690,033 B2 | 2/2004 | Yamazaki et al. |
| 6,730,948 B2 | 5/2004 | Umeda et al. |
| 6,739,931 B2 | 5/2004 | Yamazaki et al. |
| 6,740,599 B2 | 5/2004 | Yamazaki et al. |
| 6,768,259 B2 | 7/2004 | Hirano |
| 6,774,578 B2 | 8/2004 | Tanada |
| 6,777,710 B1 | 8/2004 | Koyama |
| 6,778,232 B2 | 8/2004 | Nakata et al. |
| 6,784,037 B2 | 8/2004 | Yamazaki et al. |
| 6,784,949 B1 | 8/2004 | Nagata et al. |
| 6,791,129 B2 | 9/2004 | Inukai |
| 6,791,521 B2 | 9/2004 | Isami et al. |
| 6,800,875 B1 | 10/2004 | Yamazaki |
| 6,822,629 B2 | 11/2004 | Yamazaki et al. |
| 6,825,488 B2 | 11/2004 | Yamazaki et al. |
| 6,828,950 B2 | 12/2004 | Koyama |
| 6,833,560 B2 | 12/2004 | Konuma et al. |
| 6,842,660 B2 | 1/2005 | Tripathi et al. |
| 6,855,954 B1 | 2/2005 | Zhang |
| 6,867,434 B2 | 3/2005 | Yamazaki |
| 6,875,999 B2 | 4/2005 | Koyama et al. |
| 6,879,309 B2 | 4/2005 | Yamauchi et al. |
| 6,900,462 B2 | 5/2005 | Suzawa et al. |
| 6,903,377 B2 | 6/2005 | Yamazaki et al. |
| 6,905,903 B2 | 6/2005 | Hasegawa et al. |
| 6,909,114 B1 | 6/2005 | Yamazaki |
| 6,911,688 B2 | 6/2005 | Yamazaki et al. |
| 6,936,846 B2 | 8/2005 | Koyama et al. |
| 6,940,180 B1 | 9/2005 | Uchiyama |
| 6,943,369 B2 | 9/2005 | Hayashi |
| 6,955,953 B2 | 10/2005 | Yamazaki et al. |
| 6,958,251 B2 | 10/2005 | Yamazaki et al. |
| 6,958,489 B2 | 10/2005 | Kimura |
| 6,967,129 B2 | 11/2005 | Yamazaki et al. |
| 6,972,263 B2 | 12/2005 | Yamazaki et al. |
| 6,972,435 B2 | 12/2005 | Ohtani |
| 6,977,394 B2 | 12/2005 | Yamazaki et al. |
| 7,038,239 B2 | 5/2006 | Murakami et al. |
| 7,057,694 B2 | 6/2006 | Shiota |
| 7,084,517 B2 | 8/2006 | Uchiyama |
| 7,132,693 B2 | 11/2006 | Konuma et al. |
| 7,138,967 B2 | 11/2006 | Kimura |
| 7,141,821 B1 | 11/2006 | Yamazaki et al. |
| 7,142,781 B2 | 11/2006 | Koyama et al. |
| 7,148,510 B2 | 12/2006 | Yamazaki et al. |
| 7,242,021 B2 | 7/2007 | Yamazaki et al. |
| 7,256,421 B2 | 8/2007 | Yamazaki et al. |
| 7,274,349 B2 | 9/2007 | Yamauchi et al. |
| 7,301,209 B2 | 11/2007 | Takemura et al. |
| 7,342,251 B2 | 3/2008 | Yamazaki et al. |
| 7,361,931 B2 | 4/2008 | Yamazaki |
| 7,365,393 B2 | 4/2008 | Yamazaki et al. |
| 7,375,376 B2 | 5/2008 | Yamazaki et al. |
| 7,442,991 B2 | 10/2008 | Yamazaki et al. |
| 7,843,407 B2 | 11/2010 | Yamauchi et al. |
| 7,855,381 B2 | 12/2010 | Yamazaki |
| 7,859,520 B2 | 12/2010 | Kimura |
| 7,973,867 B2 | 7/2011 | Shiota |
| 8,120,031 B2 | 2/2012 | Yamazaki et al. |
| 8,203,147 B2 | 6/2012 | Yamazaki |
| 8,599,109 B2 | 12/2013 | Kimura |
| 2001/0005606 A1 | 6/2001 | Tanaka et al. |
| 2001/0009283 A1 | 7/2001 | Arao et al. |
| 2001/0030322 A1 | 10/2001 | Yamazaki et al. |
| 2001/0036462 A1 | 11/2001 | Fong et al. |
| 2001/0051416 A1 | 12/2001 | Yamazaki et al. |
| 2001/0053559 A1 | 12/2001 | Nagao et al. |
| 2001/0055841 A1 | 12/2001 | Yamazaki et al. |
| 2002/0036462 A1 | 3/2002 | Hirano |
| 2002/0051382 A1 | 5/2002 | Matsubara et al. |
| 2002/0052124 A1 | 5/2002 | Raaijimakers et al. |
| 2002/0055206 A1 | 5/2002 | Zhang |
| 2002/0071072 A1 | 6/2002 | Ohtani et al. |
| 2002/0132399 A1 | 9/2002 | Shibata et al. |
| 2002/0145116 A1 | 10/2002 | Choo et al. |
| 2002/0155706 A1 | 10/2002 | Mitsuki et al. |
| 2002/0163043 A1 | 11/2002 | Zhang et al. |
| 2002/0177326 A1 | 11/2002 | Klee et al. |
| 2002/0179969 A1 | 12/2002 | Miyazaki et al. |
| 2002/0195603 A1 | 12/2002 | Arao et al. |
| 2003/0057419 A1 | 3/2003 | Murakami et al. |
| 2003/0090447 A1 | 5/2003 | Kimura |
| 2003/0129790 A1 | 7/2003 | Yamazaki et al. |
| 2003/0173570 A1 | 9/2003 | Yamazaki et al. |
| 2003/0189207 A1 | 10/2003 | Murakami et al. |
| 2003/0189210 A1 | 10/2003 | Yamazaki et al. |
| 2003/0193054 A1 | 10/2003 | Hayakawa et al. |
| 2003/0197178 A1 | 10/2003 | Yamazaki et al. |
| 2003/0206332 A1 | 11/2003 | Yamazaki et al. |
| 2003/0210358 A1 | 11/2003 | Zhang et al. |
| 2003/0230764 A1 | 12/2003 | Yamazaki et al. |
| 2004/0023445 A1 | 2/2004 | Miyazaki et al. |
| 2004/0051102 A1 | 3/2004 | Miyazaki et al. |
| 2004/0072380 A1 | 4/2004 | Yamazaki et al. |
| 2004/0075094 A1 | 4/2004 | Yamazaki et al. |
| 2004/0080263 A1 | 4/2004 | Yamazaki et al. |
| 2004/0135181 A1 | 7/2004 | Yamazaki et al. |
| 2005/0056848 A1 | 3/2005 | Yamazaki et al. |
| 2005/0056948 A1 | 3/2005 | Uchiyama |
| 2005/0087741 A1 | 4/2005 | Yamazaki |

(56) References Cited

U.S. PATENT DOCUMENTS

| | | |
|---|---|---|
| 2005/0132549 A1 | 6/2005 | Shih et al. |
| 2005/0205868 A1 | 9/2005 | Yamazaki et al. |
| 2005/0233507 A1 | 10/2005 | Yamazaki et al. |
| 2005/0276912 A1 | 12/2005 | Yamamoto et al. |
| 2005/0282305 A1 | 12/2005 | Murakami et al. |
| 2005/0287722 A1 | 12/2005 | Zhang |
| 2006/0060861 A1 | 3/2006 | Yamazaki et al. |
| 2007/0001236 A1 | 1/2007 | Yamazaki et al. |
| 2007/0096106 A1 | 5/2007 | Yamazaki et al. |
| 2007/0096224 A1 | 5/2007 | Takemura et al. |
| 2007/0184665 A1 | 8/2007 | Yamazaki et al. |
| 2007/0278489 A1 | 12/2007 | Yamazaki et al. |
| 2008/0061299 A1 | 3/2008 | Takemura et al. |
| 2008/0230871 A1 | 9/2008 | Yamazaki et al. |
| 2008/0246039 A1 | 10/2008 | Zhang |
| 2009/0014724 A1 | 1/2009 | Yamazaki et al. |
| 2009/0072235 A1 | 3/2009 | Zhang et al. |
| 2011/0090209 A1 | 4/2011 | Yamauchi et al. |
| 2011/0309364 A1 | 12/2011 | Yamazaki et al. |

FOREIGN PATENT DOCUMENTS

| | | |
|---|---|---|
| EP | 0 680 082 A1 | 11/1995 |
| EP | 0 878 840 A1 | 11/1998 |
| EP | 1 031 873 A2 | 8/2000 |
| EP | 1049176 | 11/2000 |
| EP | 1065725 A | 1/2001 |
| EP | 1 081 676 A1 | 3/2001 |
| EP | 1 122 773 A2 | 8/2001 |
| EP | 1 128 430 A2 | 8/2001 |
| EP | 1 128 439 A2 | 8/2001 |
| EP | 1 148 553 A2 | 10/2001 |
| EP | 1 566 837 A2 | 8/2005 |
| EP | 1615275 A | 1/2006 |
| EP | 2259328 | 12/2010 |
| EP | 2262031 A | 12/2010 |
| JP | 55-041703 | 3/1980 |
| JP | 56-081973 | 7/1981 |
| JP | 56-111258 | 9/1981 |
| JP | 57-058363 | 4/1982 |
| JP | 57-104218 | 6/1982 |
| JP | 58-037967 | 3/1983 |
| JP | 58-197761 | 11/1983 |
| JP | 60-136259 | 7/1985 |
| JP | 60-202931 | 10/1985 |
| JP | 61-220341 | 9/1986 |
| JP | 62-084562 | 4/1987 |
| JP | 62-274729 | 11/1987 |
| JP | 63-043330 | 2/1988 |
| JP | 63-314862 | 12/1988 |
| JP | 64-054762 | 3/1989 |
| JP | 01-156725 | 6/1989 |
| JP | 02-025024 | 1/1990 |
| JP | 02-039541 | 2/1990 |
| JP | 02-044769 | 2/1990 |
| JP | 02-100024 | 4/1990 |
| JP | 02-159730 | 6/1990 |
| JP | 02-214152 | 8/1990 |
| JP | 02-234134 | 9/1990 |
| JP | 03-020046 | 1/1991 |
| JP | 03-095938 | 4/1991 |
| JP | 03-095939 | 4/1991 |
| JP | 03-126921 | 5/1991 |
| JP | 03-280018 | 12/1991 |
| JP | 03-280420 | 12/1991 |
| JP | 04-139828 | 5/1992 |
| JP | 04-142740 | 5/1992 |
| JP | 04-155834 | 5/1992 |
| JP | 04-180219 | 6/1992 |
| JP | 04-196328 | 7/1992 |
| JP | 04-239731 | 8/1992 |
| JP | 04-299566 | 10/1992 |
| JP | 04-358129 | 12/1992 |
| JP | 05-055581 | 3/1993 |
| JP | 05-055582 | 3/1993 |
| JP | 05-082442 | 4/1993 |
| JP | 05-114724 | 5/1993 |
| JP | 05-226364 | 9/1993 |
| JP | 05-232515 | 9/1993 |
| JP | 05-249478 | 9/1993 |
| JP | 05-259458 | 10/1993 |
| JP | 05-275373 | 10/1993 |
| JP | 05-299581 | 11/1993 |
| JP | 06-067210 | 3/1994 |
| JP | 06-130414 | 5/1994 |
| JP | 06-169086 | 6/1994 |
| JP | 06-232160 | 8/1994 |
| JP | 06-242433 | 9/1994 |
| JP | 06-267210 | 9/1994 |
| JP | 06-267982 | 9/1994 |
| JP | 06-291314 | 10/1994 |
| JP | 06-308531 | 11/1994 |
| JP | 06-337436 | 12/1994 |
| JP | 06-338612 | 12/1994 |
| JP | 07-056190 | 3/1995 |
| JP | 07-273191 | 10/1995 |
| JP | 07-335756 | 12/1995 |
| JP | 08-152651 | 6/1996 |
| JP | 08-181214 | 7/1996 |
| JP | 08-203876 | 8/1996 |
| JP | 09-197390 A | 7/1997 |
| JP | 10-020342 A | 1/1998 |
| JP | 10-039334 | 2/1998 |
| JP | 10-041519 | 2/1998 |
| JP | 10-048668 | 2/1998 |
| JP | 10-056182 | 2/1998 |
| JP | 10-068970 | 3/1998 |
| JP | 10-068972 | 3/1998 |
| JP | 10-307305 | 11/1998 |
| JP | 11-103069 | 4/1999 |
| JP | 11-183929 | 7/1999 |
| JP | 11-345981 | 12/1999 |
| JP | 2000-227776 A | 8/2000 |
| JP | 2000-267128 A | 9/2000 |
| JP | 2000-284722 | 10/2000 |
| JP | 2000-305106 A | 11/2000 |
| JP | 2000-312007 | 11/2000 |
| JP | 2001-013893 | 1/2001 |
| JP | 2001-042822 A | 2/2001 |
| JP | 2001-076873 A | 3/2001 |
| JP | 2001-94112 | 4/2001 |
| JP | 2001-102165 | 4/2001 |
| JP | 2002-144301 | 5/2001 |
| JP | 2001-189462 | 7/2001 |
| JP | 2001-203076 | 7/2001 |
| JP | 2001-223267 | 8/2001 |
| JP | 2001-281704 | 10/2001 |
| JP | 2001-282137 | 10/2001 |
| JP | 2001-305576 A | 10/2001 |
| JP | 2001-313397 | 11/2001 |
| JP | 2001-318622 | 11/2001 |
| JP | 2001-318628 | 11/2001 |
| JP | 2001-356711 | 12/2001 |
| JP | 2002-006777 | 1/2002 |
| JP | 2002-026331 | 1/2002 |
| JP | 2002-57162 | 2/2002 |
| JP | 2002-149087 | 5/2002 |
| JP | 2002-514320 | 5/2002 |
| JP | 2002-278497 A | 9/2002 |
| JP | 2003-017273 | 1/2003 |
| JP | 2003-37271 | 2/2003 |
| JP | 2003-066909 A | 3/2003 |
| JP | 2004-079509 | 3/2004 |
| KR | 1992-0010788 A | 6/1992 |
| KR | 10-0198634 B1 | 6/1999 |
| KR | 10-0254567 B1 | 5/2000 |
| KR | 10-0289490 B1 | 11/2001 |
| WO | WO-92/14268 A1 | 8/1992 |
| WO | WO-98/48403 | 10/1998 |

(56) References Cited

FOREIGN PATENT DOCUMENTS

WO  WO-03/027997      4/2003
WO  WO-03/038533 A1   5/2003

OTHER PUBLICATIONS

Bonnel.M et al., "Si Poly TFT's With Low Off-Current for Flat Panel Displays", Eurodisplay '93 : The 13th International Display Research Conference, 1993, pp. 199-202.

Shimoyama. N et al., "30P-Zm-3 Increased Hot-Carrier Degradation Due to Water in TeOs/O3—Oxide,", Extended Abstracts (The 39th Spring Meeting, 1992); The Japan Society of Applied Physics and Related Societies, Mar. 28, 1992, No. 2, p. 723.

Shimoyama. N et al., "30P-Zm-4 Increased Hot-Carrier Degradation Due to Water in TeOs/O3—Oxide(2)-Water Blocking Effect of an ECR-SiO2 Film Under TeOs/O3—Oxide and Improvement of Hot-Carrier Tolerance", Extended Abstracts (The 39th Spring Meeting, 1992); The Japan Society of Applied Physics and Related Societies, Mar. 28, 1992, No. 2, p. 723.

11: signal line
12: selecting gate line
13: current line
14: power source line
15: erase gate line
16: current gate line
17: selecting transistor
18: driver transistor
19: video Cs
20: erase transistor
21: current source transistor
22: input transistor
23: retention transistor
24: current source Cs
25: light-emitting device 11: signal line
12: selecting gate line
13: current line
14: power source line
15: erase gate line
16: current gate line
17: selecting transistor
18: driver transistor
19: video Cs
20: erase transistor
21: current source transistor
22: input transistor
23: retention transistor
24: current source Cs
25: light-emitting device ※ Refer to Table 1 for Sputtering Conditions ※Refer to Table 1 or Table 2 for deposition conditions, respectively (A) C-V characteristics of MOS structure in case of not having Li diffusion source (B) C-V characteristics of MOS structure in case of having Li diffusion source (A) MOS structure using PCVD-SiN film (B) MOS structure using RFSP-SiN film

DISPLAY DEVICE WITH CAPACITOR ELEMENTS

BACKGROUND OF THE INVENTION

1. Field of the Invention

The present invention relates to a technical field concerning a light-emitting apparatus as typified by a display device (apparatus) using a semiconductor device (typically, a transistor) as a device, especially, an electroluminescent display device, and a technical field concerning an electric appliance provided with the display device to an image display unit thereof.

2. Description of the Related Art

In recent years, a liquid crystal display device formed by integrating a transistor (especially, a thin film transistor) over a substrate and an electroluminescent display device has been well developed. These display device is operated as an image display device by forming a transistor on a glass substrate by using thin film formation technique, and disposing the transistor to each pixel arranged in a matrix configuration.

There are various specifications required to a region for displaying image of the display device (hereinafter, a pixel portion), for example, high-resolution with many number of dots, a large effective display region in each pixel, high luminance image display, no deterioration causing point defects or line defects throughout the pixel portion, or the like. In order to meet these specifications, it is required that not only transistors arranged in each pixel has good performance, but also technique for manufacturing transistors with good yields and in the stable process.

The way of preventing deteriorations of an organic compound become an important issue of an organic electroluminescent display device among other electroluminescent display device for obtaining reliability since the organic electroluminescent display device uses an organic compound as a light-emitting device serving as a light source. That is, in order to manufacture a high reliable display device, it is necessary that the reliability measure be implemented in view of not only the manufacturing process but also the deterioration with time of the completed light-emitting device.

SUMMARY OF THE INVENTION

It is an object of the present invention to provide the structure for preventing the deterioration of a light-emitting device as much as possible and the structure for retaining sufficiently a capacitor element (a condenser) required to each pixel in a light-emitting device as typified by an electroluminescent display device.

A subject-matter of the present invention is to provide a display device that comprises means for solving the above-described problem, that is, means for preventing adverse effects due to the deterioration with time of a flattening film and means for keeping large charge retention characteristics without deteriorating an opening ratio. That is, the display device has a pixel portion in which the flattening film that covers a transistor is sealed by a fine insulating film such as a silicon nitride film, or the like, for preventing the deterioration with time of the flattening film, and a capacitor element having a lamination structure is formed by utilizing merits of multiple wirings for giving the capacitor element large charge retention characteristics without deteriorating an opening ratio.

As used in this specification, the term "light-emitting device" refers to a device that has an illuminant (a light-emitting layer, a carrier injection layer, a carrier transportation layer, a carrier blocking layer, or a lamination layer of organic compounds or inorganic compounds necessary for generating luminescence) interposed between a pair of electrodes (an anode or a cathode). For example, an electroluminescent device is included in the light-emitting device.

Specifically, in the present invention, a display device that comprises a semiconductor, a gate insulating film over the semiconductor, a first metal layer over the gate insulating film, a first passivation film provided over the semiconductor (an active layer), a second metal layer over the first passivation film, a flattening film over the second metal layer, a barrier film over the flattening film, and the third metal layer over the barrier film, wherein a side face of a first opening provided with the flattening film is covered by the barrier film; a second opening provided with a lamination having the gate insulating film, the first passivation film, the barrier film is formed inside the first opening; and the third metal layer is connected to the semiconductor via the first opening and the second opening, the display device comprising: a first capacitor element comprising the semiconductor, the gate insulating film, and the first metal layer; and a second capacitor element comprising the first metal layer, the first passivation film, and the second metal layer.

Specifically, in the present invention, in the case that the capacitor element has the configuration: a first capacitor element comprising the semiconductor, the gate insulating film, and the first metal layer; a second capacitor element comprising the first metal layer, the first passivation film, and the second metal layer; and a third capacitor element comprising the second metal layer, the barrier film, and the third metal layer, a charge injection property can be further improved.

In the present invention, a capacitor element may have the configuration: a first capacitor element comprising the semiconductor, the first gate insulating film, and the first metal layer; and a second capacitor element comprising the first metal layer, the first passivation film, the barrier film, and the third metal layer.

In the present invention, a capacitor element may have the configuration: a capacitor element composed of the semiconductor, the gate insulating film, the first passivation film, the barrier film, and the third metal layer.

In the present invention, a capacitor element may have the configuration: a capacitor element comprising the semiconductor, the gate insulating film, the first passivation film, and the second metal layer.

In the present invention, a capacitor element may have the configuration: a capacitor element comprising the first metal layer, the first passivation film, and the second metal layer.

BRIEF DESCRIPTIONS OF THE DRAWINGS

DETAILED DESCRIPTION OF THE INVENTION

Hereinafter, embodiment modes relating to the display device of the present invention will be described in detail with reference to the drawings.

Embodiment Mode 1

Figure 1:
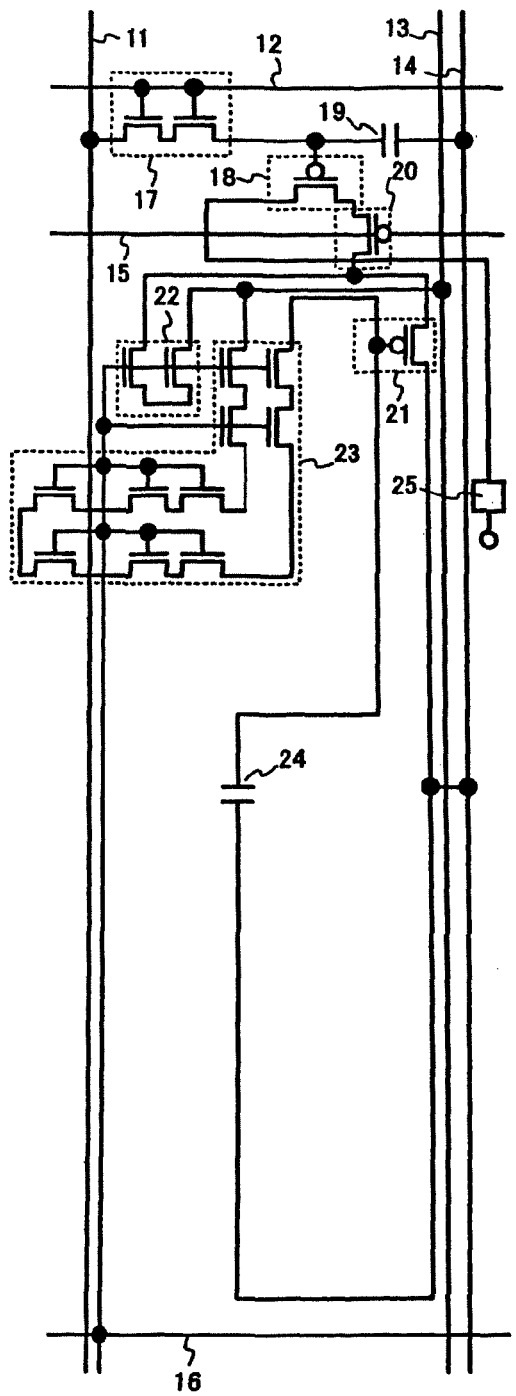
FIG. 1 shows a top surface view and a circuit diagram of a pixel structure of a display apparatus.

This embodiment mode shows one example of an electroluminescent display device according to the present invention. FIG. 1A is a view showing a top surface circuit (CAD), and FIG. 1B is a view showing a frame format of the circuit structure of FIG. 1A. Each pixel of an electroluminescent display device shown in FIG. 1B has a signal line 11, a selecting gate line 12, a current line 13, a power source line (a line for supplying constant voltage or constant current) 14, an erase gate line 15, and a current gate line 16. A selecting transistor 17, a driver transistor 18, a video Cs (a capacitor element for a video) 19, an erase transistor 20, a current source transistor 21, an input transistor 22, a retention transistor 23, a current source Cs (a capacitor element for a current source) 24, and a light-emitting device 25 are provided with each pixel. The circuit structure of pixel described in this embodiment mode is disclosed in Application Number (2001) 289983 disclosed by the present applicant. The circuit structure is a novel structure by the present applicant.

As characteristics of the electroluminescent display device described in this embodiment mode, an area of opening ratio (a ratio of effective display region in a pixel area) is not decreased even if any circuit is built beneath a pixel electrode (an anode or a cathode) since light is extracted from the opposite side of a substrate on which a transistor is formed. Of course, the present invention is not exclusively applied to the structure shown in FIGS. 1A and 1B. The present invention can be appropriately applied to another circuit structure by a skilled person.

Figure 2:
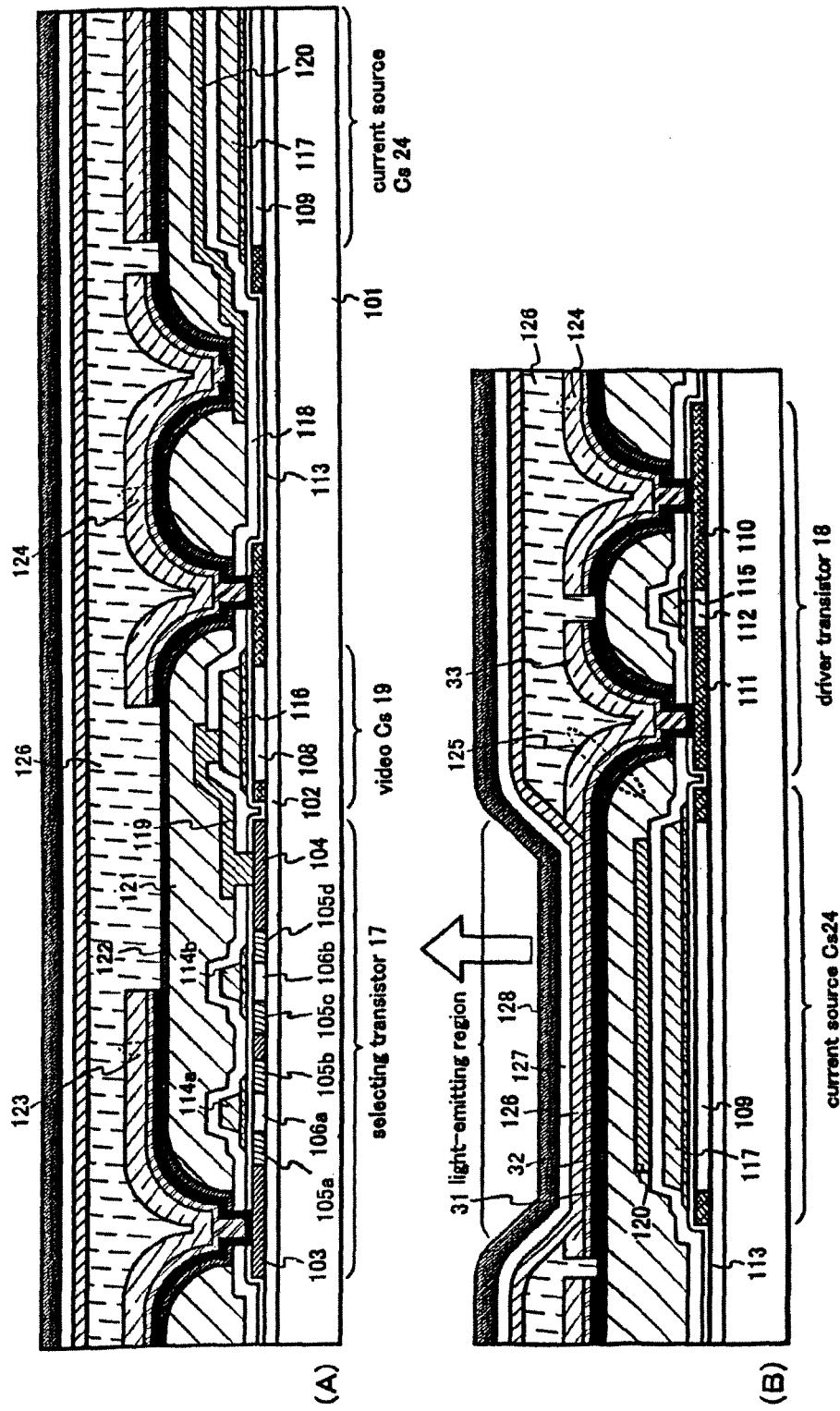
FIGS. 2A-2B shows a cross-sectional view showing a device structure of a display apparatus.

FIGS. 2A and 2B are views showing a typical cross-sectional structure of one pixel of the electroluminescent display device shown in FIGS. 1A and 1B. FIG. 2A is a cross-sectional view of a selecting transistor 17 and a current source Cs (current source capacitor element) 14. FIG. 2B is a cross-sectional view of a current source Cs 24 and a driver transistor 18.

In FIG. 2A, reference numeral 101 denotes a substrate. For the substrate, a glass substrate, a ceramic substrate, a quartz substrate, a silicon substrate, or a plastic substrate (including a plastic film) can be used. Reference numeral 102 denotes a base film formed of a silicon nitride oxide film, a silicon oxynitride film, or a lamination film of these films. In addition, semiconductors that serve as an active layer of the selecting transistor 17 are built over the base film 102. The active layer has a source region 103, a drain region 104, LDD regions 105a to 105d, and channel formation regions 106a, 106b. Two channel formation regions and four LDD regions are provided between the source region 103 and the drain region 104. At the same time, a lower electrode 108 of the video Cs 19, a lower electrode 109 of the current source Cs 24, and a source region 110, a drain region 111, and a channel formation region 112 that is composing an active layer of the driver transistor 18 are formed.

The source region 103, the drain region 104, and LDD regions 105a to 105d of the selecting transistor 17 are n-type impurity regions. The source region 110 and the drain region 111 of the driver transistor 18 are p-type impurity regions. The channel formation regions 106a and 106b of the selecting transistor 17, the channel formation region 112 of the driver transistor 18, a first electrode (lower electrode) 108 of the video Cs 19, and a first electrode (lower electrode) 109 of the current source Cs 24 is an intrinsic semiconductor (so-called, i-type).

A silicon oxide film, a silicon oxynitride film (hereinafter, which refers to a silicon compound film containing Si of from 25 to 35 atom %, oxygen of from 55 to 65 atom %, nitride of from 1 to 20 atom %, hydrogen of from 0.1 to 10 atom %,), an aluminum nitride film, an aluminum oxide film, an aluminum oxynitride film, or a gate insulating film 113 formed of a lamination layer of these insulating films and a silicon nitride film are formed over these semiconductors. The gate insulating film 113 serves as a gate insulating film for the selecting transistor 17 and the driver transistor 18, moreover, as a dielectric of the video Cs 19 and a first dielectric of (lower side derivative) the current source Cs 24.

A gate electrodes 114a and 114b of the selecting transistor 17, and a gate electrode 115 of the driver transistor 18 are formed over the gate insulating film 113 by patterning a first metal layer. In each gate electrode, the first layer of the electrode (a tantalum nitride film) and the second layer of the electrode (a tungsten film) have different shapes. The line width of the first layer of the electrode is larger than that of the second layer of the electrode. A fabrication method for forming the characteristic, a reason for forming the electrode having such structure, an advantage of this structure, and the like, are disclosed in unexamined patent publication No. 2002-57162 by the present applicant. A second electrode (an upper side electrode) 116 of the video Cs 19 and a second electrode (a medium electrode) 117 of the current source Cs 24 are provided simultaneously with forming the gate electrode.

A silicon nitride oxide film (hereinafter, a silicon compound film containing Si of from 25 to 35 atom %, oxygen of from 15 to 30 atom %, nitride of from 20 to 35 atom %, hydrogen of from 15 to 30 atom %, and so forth) is formed as a first passivation film 118 over the gate electrode and Cs electrode. A silicon nitride film is formed by plasma CVD to have a thickness of from 0.1 to 1 μm (preferably, from 0.2 to 0.5 μm). The first passivation film 118 can terminate the dangling bond of the semiconductor which serves as an active layer with hydrogen generated by heat in the first passivation film 118 in the concentration range of form 15 to 25 atom %. Moreover, the first passivation film 118 can be served as a second dielectric (upper side dielectric) in the current source Cs 24.

A drain wiring of the selecting transistor 17 and a third electrode (an upper side electrode) 120 of the current source Cs 24 are formed over the first passivation film 118 by patterning a second metal layer. The drain wiring 119 connects electrically to the drain region 104 of the selecting transistor 17 and the second electrode 116 of the video Cs 19. In addition, any metal layer can be used as the second metal layer, more preferably, a low resistive aluminum film or a copper thin film (including a copper alloy film) is used. It is desirable that adhesiveness with a flattening film 121 that is formed over the second metal layer is considered.

A flattening film 121 is formed to have a thickness ranging from 0.5 to 3 μm over the drain wiring 119 and the third electrode 120. An organic resin film or an inorganic resin film that can be formed by spin-coating may be used for the flattening film 121. Of course, the flattening film 121 can be formed by using an inorganic insulating film that is formed by CVD, sputtering, or another vapor deposition and polished (by mechanical polishing, chemical polishing, or combination of these). For implementation of the present invention, it is preferable to use a photosensitive organic resin film (preferably, a positive type) which can be formed without processing in plasma. Since the photosensitive organic resin film can be patterned by only etching using developer, it can be formed without leaving plasma damage inside the film.

After the process of exposing and developing, the flattening film 121 is provided with the source region 103 of the selecting transistor 17, source regions 110 and 111 of the driver transistor 18, the first electrode 108 of the video Cs 19 (strictly, a p-type impurity region formed adjacent to first electrode 18), and an opening (hereinafter, an opening which is provided with the flattening film 121 is referred to as a first opening) is formed at upper portion of the third electrode 120 of the current source Cs 24. A barrier film 122 is formed ranging from 30 to 100 nm in thick (preferably, from 40 to 60 nm in thick) so as to cover the flattening film having the first opening. Then, an opening is provided with the barrier film 122, the first passivation film 118, and the gate insulating film 113 (hereinafter, an opening which is provided with these insulating films is referred to as a second opening) inside the first opening.

The barrier film 122 is characterized that it is formed of a silicon nitride film having extreme delicate membranous as will hereinafter be described in detail.

In the first opening, the barrier film 122 and the passivation film 118 is in contact with each other at 1 to 5 μm (typically, 2 to 3 μm) so that the flattening film 121 is completely sealed with the barrier film 122 and the first passivation film 118. As a result, even when an organic resin film or a spin-on-glass film (SOG) film is used for the flattening film 121, degasification due to change in properties with time can be effectively prevented. Consequently, the deterioration of transistor characteristics and a light-emitting device with time can also be prevented.

A source wiring 123 of the selecting transistor 17 (which corresponds to the signal line 11 shown in FIG. 1B), a connection wiring 124 (that serves as a source wiring of the driver transistor 18 and corresponds to the power source line 14 shown in FIG. 1B) for connecting the first electrode 108 of the video Cs 19 to the third electrode 120 of the current source Cs 24, and a pixel electrode 125 are provided. These electrodes are connected to the corresponding electrodes via the first opening and the second opening, respectively. In this embodiment mode, these electrodes have a three-layer structure, that is, a titanium film 31, a titanium nitride film 32, and an aluminum film 33 from the bottom (hereinafter, the aluminum film 33 is included an aluminum film added with aluminum alloy film or other elements). As the reason why the structure is adopted: 1) The titanium layer is preferable for the bottom layer in order to have a good ohmic contact with the silicon film. 2) The titanium nitride film is preferable in order to reduce the contact resistance of the titanium film and the aluminum film. 3) The titanium nitride film can be used for a pixel electrode (an anode of a light-emitting device). 4) The light-extraction efficiency may be improved by utilizing the cross-sectional surface of the aluminum film.

In this embodiment mode, the electrode serving as the pixel electrode 125 is composed of the titanium film 31, the titanium nitride film 32, and the aluminum film 33. The titanium nitride film 32 is exposed by removing selectively aluminum film 33 in a light-emitting region (an effective display region). Consequently, the surface of the titanium nitride film 32 can be utilized as an anode of the light-emitting device 25. In addition, when the aluminum film 33 is etched by using the organic resin film 126, the aluminum film 33 is formed to have a tapered shape so as to reflect light through the illuminant 126 in the lateral direction, which is effective in improving light-extraction efficiency on the whole. The reflection efficiency can be seen throughout a range of the pixel electrode, that is, according with an outline of the pixel electrode.

Further, an illuminant (hereinafter, a carrier injection layer, a carrier transporting layer, a carrier blocking layer, a light-emitting layer, an organic or an inorganic material contributing to the recombination of carriers, or a lamination layer of these materials) 126 is interposed between an anode (a titanium nitride film) 32 and a cathode (hereinafter, refers to an electrode containing elements belonging to the first or the second group in the periodic table) 127 to be formed into a light-emitting device 25. Then, the light-emitting device 25 is protected by the second passivation film 128. The second passivation film 128 can be formed of the same material for forming the first passivation film 118, preferably, the same material for forming the barrier film 122 in order to strengthen the protective property. Further, the illuminant 126 can be formed of any known material.

The pixel structure (FIG. 1A) of the electroluminescent display device including the above structures according to the present invention has the characteristics: the selecting gate line 12, the erasing gate line 15, and a current gate line 16 are all formed of the same metal layer (the first metal layer), the signal line 11, a current line 13, and a power source line 14 are all formed of the same metal layer (the second metal layer), and the crossed portion of the first metal layer and the second metal layer is bridged by a third metal layer that is provided at higher portion than the second metal layer.

In case that the first metal layer and the second metal layer are crossed each other, parasitic capacitance is formed since only the first passivation film 118 having comparative thin film thickness of from 0.1 to 0.5 μm is presented therebetween. However, in the case that the first metal layer and the third metal layer is crossed each other, the parasitic capacitance can be almost negligible since the flattening film 121 having thick thickness of from 0.5 to 3 μm.

The device structure has the characteristic: firstly, there are no any problems of the deterioration with time due to degasification of the flattening film 121 since the flattening film 121 is sealed with the first passivation film 118 and the barrier film 122. Consequently, high reliable display device can be manufactured.

Secondly, a large capacitance value can be retained with small area by forming the capacitor element to have a lamination layer. For example, the current source Cs 24 has the structure, wherein the first capacitor element is composed of the first electrode 109, the second electrode 117, and the dielectric (the gate insulating film) 113 and the second capacitor element is composed of the second electrode 117, the third electrode 120, and the dielectric (the first passivation film) 118 are connected in series. Though not shown, the first electrode 109 and the third electrode 120 have the fixed electrical potential (or the same electrical potential). Therefore, a large capacitor value can be retained with small area by forming the capacitor element to have a lamination structure that comprises the first capacitor element composed of the semiconductor/the gate insulating film/the first metal layer, and the second capacitor composed of the first metal layer/the first passivation film/the second metal layer.

In the video Cs 19, a capacitor element is composed of the first electrode 108, the second electrode 116, and the dielectric (the gate insulating film) 113. In such case that it is unnecessary to form a lamination structure, it is possible to form a capacitor element using two electrodes.

Thirdly, a high-luminance electroluminescent display device can be manufactured by improving light-extraction efficiency by using a pixel electrode 125 that has a specialized structure into an anode of the light-emitting device 25. "High-luminance" means that bright images can be exhibited with low power consumption. The low power consumption can slow the deterioration of the light-emitting device 25 and improve the reliability of the light-emitting device.

Thus, the electroluminescent display device of this embodiment mode has high brightness and reliability and can retain sufficient capacitor value (capacitor value for retaining charge) that is required by each pixel by means of using multiple wirings.

A silicon nitride film used in the present invention is a silicon nitride film having an extreme delicate membranous formed by RF sputtering under the process conditions per Table 1 (a typical example is also described therein). Note that in the present invention, the silicon nitride film described here can be applied to all constitutions where a silicon nitride film is used. The term used in Table 1 "RFSP-SiN" refers to a silicon nitride film formed by RF sputtering. In addition, the term "T/S" refers to a distance between a target and a substrate.

TABLE 1

Process Condition of RFSP-SiN

| | Process Conditions | Typical Example | Others |
|---|---|---|---|
| Gas | $N_2$ or rare gas/$N_2$ | Ar/$N_2$ | The purity of all gas are not more than 4N |
| Gas flow ratio | N2: 30~100%, rare: 0~70% | Ar:$N_2$ = 20:20 (sccm) | Rare gas can be introduced from behind the substrate as heat gas. |
| Pressure (Pa) | 0.1~1.5 | 0.8 | |
| Frequency (MHz) | 13~40 | 13.56 | |
| Electric power (W/cm$^2$) | 5~20 | 16.5 | |
| Substrate Temperature (° C.) | RT~350 | 200 | |
| Target Material | Materials from single crystal Si ingot | Si(1~10 Ωcm) | |
| T/S (mm) | 40~200 | 60 | |
| Back Pressure (Pa) | At most $1 \times 10^{-3}$ (preferably, at most $3 \times 10^5$) | $3 \times 10^{-5}$ | Using a turbo-molecular pump or a cryopump |

Ar used as sputtering gas for heating a substrate is introduced so as to spray on back of the substrate, and mixed with N2 finally, then contributed on sputtering. Deposition conditions shown in Table 1 are just a typical example, and not limited to the described numeral value in Table 1. As long as a physical of a deposited SiN film is in the range of the one that will be subsequently described in Table 4, the deposition conditions can be appropriately changed by an experimenter.

Figure 17:
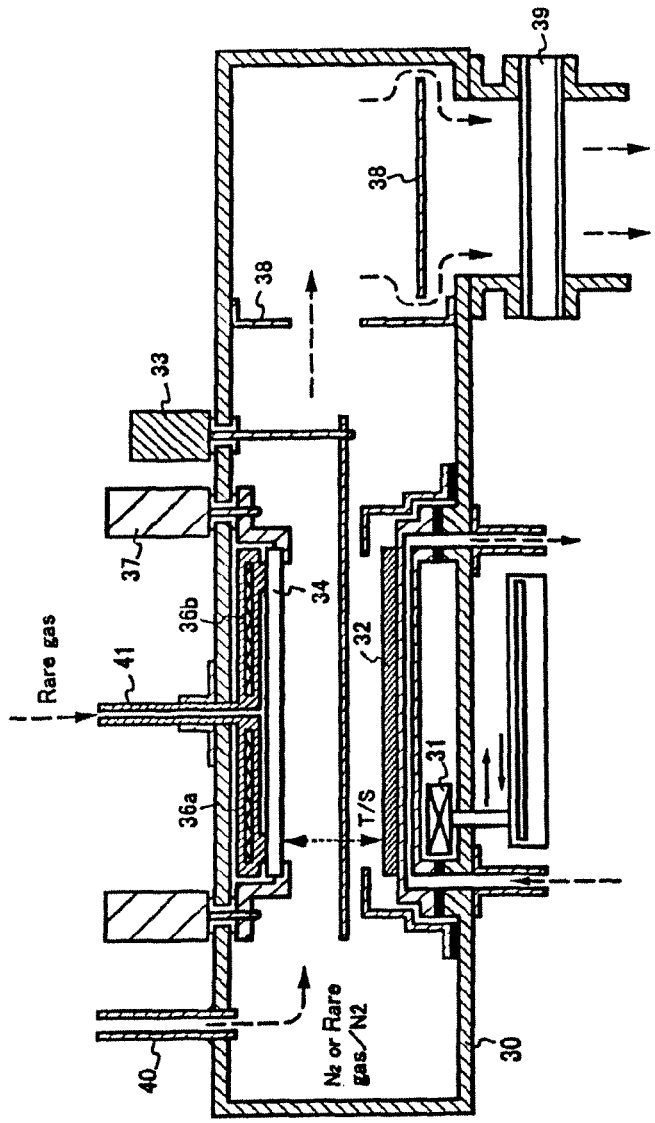
FIG. 17 shows a diagram showing a sputtering device for depositing a silicon nitride film.

FIG. 17 is a schematic diagram of a sputtering device which is used for depositing a silicon nitride film by RF sputtering. In FIG. 17, reference numeral 30 denotes a chamber wall; reference numeral 31, a movable magnet for forming a magnetic field; reference numeral 32, a silicon single crystal target; reference numeral 33, a protection shutter; reference numeral 34, a substrate to be treated; reference numerals 36a and 36b, heaters; reference numeral 37, a substrate chuck mechanism; reference numeral 38, a protection plate; and reference numeral 39, a bulb (a conductance bulb or a main bulb). Gas introducing pipes 40 and 41 are provided with the chamber wall 30 for introducing N2 (or mixture gas of N2 and rare gas) and rare gas, respectively.

Deposition conditions for forming a silicon nitride film by the conventional plasma CVD are described in Table 2 as a comparative example. Note that the term "PCVD-SiN" refers to a silicon nitride film formed by plasma CVD.

TABLE 2

Plasma CVD Condition

| | PCVD-SiN |
|---|---|
| Gas | $SiH_4/NH_3/N_2/H_2$ |
| Gas Flow Rate (sccm) | $SiH_4:NH_3:N_2:H_2$ = 30:240:300:60 |
| Pressure (Pa) | 159 |
| Frequency (MHz) | 13.56 |
| Electric Power (W/cm$^2$) | 0.35 |
| Substrate Temperature (° C.) | 325 |

The Table 3 is a comparative table of typical physical values between the silicon nitride film formed under the deposition conditions described in Table 1 and the silicon nitride film formed under the deposition conditions described in Table 2. Note that the differences between "RFSP-SiN (No. 1)" and "RFSP-SiN (No. 2)" are generated depending on film formation systems. The property of the silicon nitride film for a barrier film of the present invention is not damaged by the differences. Also, the positive and negative signs of an internal stress are changed with compression stress and tensile stress. Here, only an absolute value is described in the table.

TABLE 3

Comparison of Typical SiN Physicality

| Parameter | RFSP-SiN (No. 1) | RFSP-SiN (No. 2) | PCVD-SiN film | Others |
|---|---|---|---|---|
| | SiN Film Formed Under the Conditions Shown in Table 1 | | SiN Film Formed Under the Conditions Shown in Table 2 | |
| Relative Permittivity | 7.02~9.30 | ← | ~7 | |
| Refractive Index | 1.91~2.13 | ← | 2.0~2.1 | Wavelength 632.8 nm |
| Internal Stress (dyn/cm$^2$) | $4.17 \times 10^8$ | ← | $9.11 \times 10^8$ | |
| Etching Rate (nm/min) | 0.77~4.31 | 1~8.6 | ~30 | LAL500, 20° C. |
| Si Concentration (atomic %) | 37.3 | 51.5 | 35.0 | RBS |
| N Concentration (atomic %) | 55.9 | 48.5 | 45.0 | RBS |

TABLE 3-continued

Comparison of Typical SiN Physicality

| Parameter | SiN Film Formed Under the Conditions Shown in Table 1 | | SiN Film Formed Under the Conditions Shown in Table 2 | Others |
| --- | --- | --- | --- | --- |
| | RFSP-SiN (No. 1) | RFSP-SiN (No. 2) | PCVD-SiN film | |
| H Concentration (atoms/cc) | $4 \times 10^{20}$ | — | $1 \times 10^{22}$ | SIMS |
| O Concentration (atoms/cc) | $8 \times 10^{20}$ | — | $3 \times 10^{18}$ | SIMS |
| C Concentration (atoms/cc) | $1 \times 10^{19}$ | — | $4 \times 10^{17}$ | SIMS |

As described in Table 3, common characteristics of "RFSP-SiN (No. 1)" and "RFSP-SiN (No. 2)" are having low etching rate (hereinafter, the etching rate is measured at 20° C. using LAL 500) and low hydrogen concentration. The term "LAL 500" refers to "LAL 500 SA Buffered Hydrogen Fluoride", that is, mixed solution of NH4HF2 (7.13%) and NH4F (15.4%). In addition, an internal stress is smaller than that of absolute value of the silicon nitride film formed by plasma CVD.

Table 4 shows physical parameter of a silicon nitride film formed under the deposition conditions described in Table 1 by the present applicant.

TABLE 4

SiN Physicality Used in the Invention

| Parameter | SiN Film Used in the Invention | Others |
| --- | --- | --- |
| Relative Permittivity | 7.0~9.5 (preferably 7.3~7.7) | |
| Refractive Index | 1.85~2.20 (preferably 1.90~2.15) | wavelength 632.8 nm |
| Internal Stress (dyn/cm$^2$) | at most $2 \times 10^{10}$ (preferably, at most $5 \times 10^{8}$) | |
| Etching Rate (nm/min) | at most 9 (preferably, 0.5~3.5) | LAL500, 20° C. |
| Si Concentration (atomic %) | 35~55 (preferably, 37~52) | RBS |
| N Concentration (atomic %) | 45~60 (preferably, 48~56) | RBS |
| H Concentration (atoms/cc) | at most $1 \times 10^{21}$ (preferably, at most $5 \times 10^{20}$) | SIMS |
| O Concentration (atoms/cc) | $5 \times 10^{18}$~$5 \times 10^{21}$ (preferably, $1 \times 10^{19}$~$1 \times 10^{21}$) | SIMS |
| C Concentration (atoms/cc) | $1 \times 10^{18}$~$5 \times 10^{19}$ (preferably, $1 \times 10^{18}$~$2 \times 10^{19}$) | SIMS |

Figure 11:
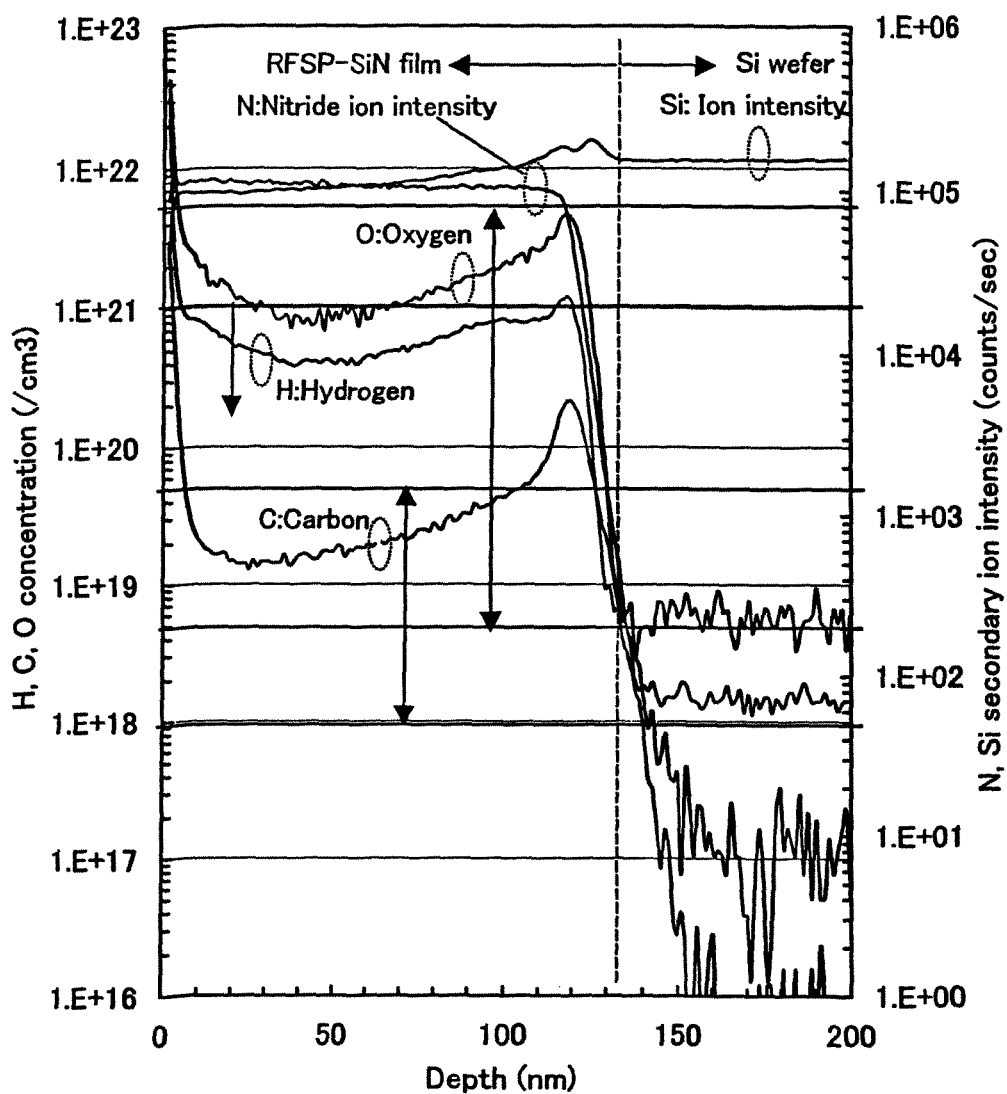
FIG. 11 shows a diagram showing an impurity distribution in a silicon nitride film.
Figure 12:
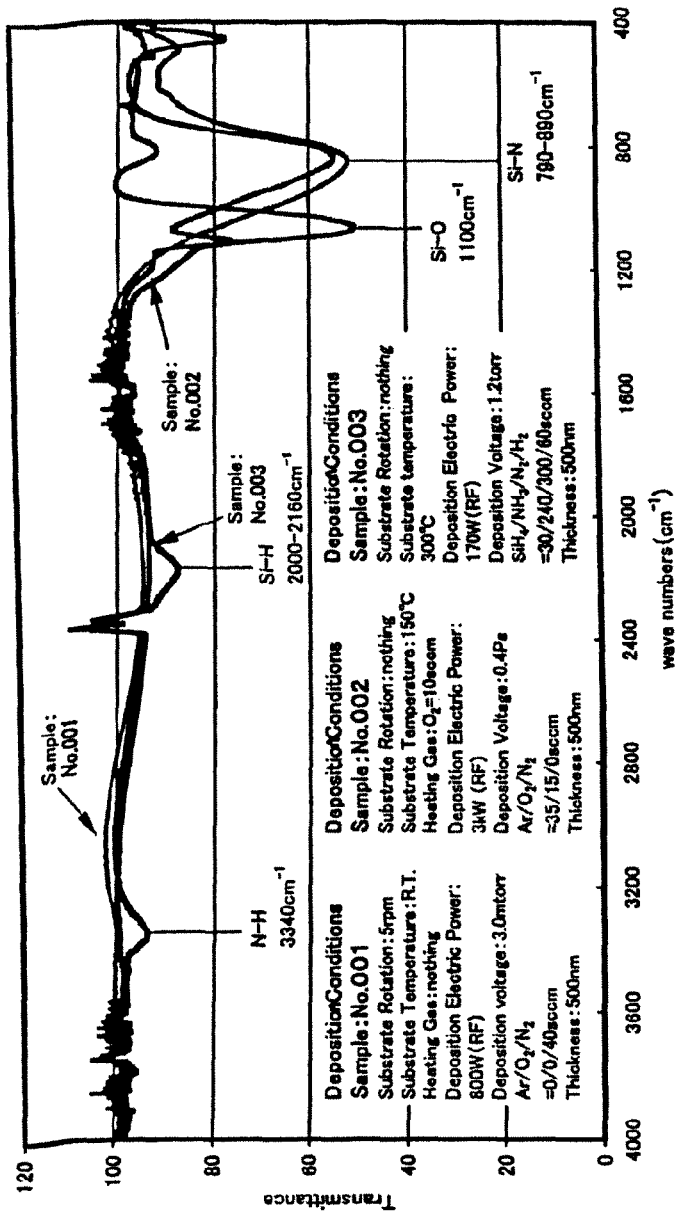
FIG. 12 shows a diagram showing FT-IR measurement results of a silicon nitride film.
Figure 13:
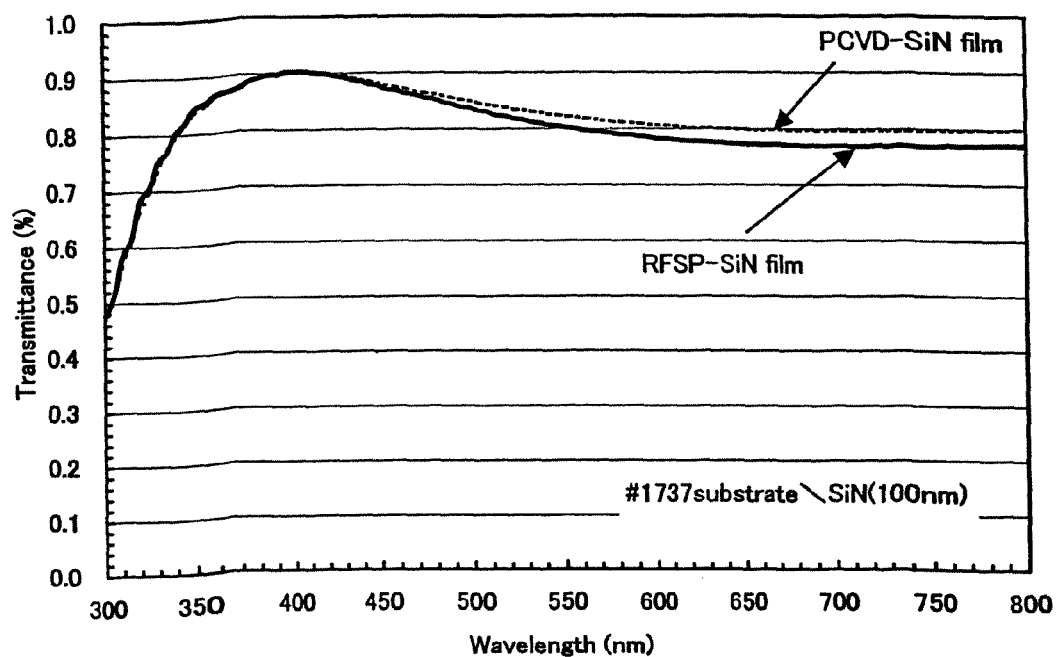
FIG. 13 shows a diagram showing transmittance of a silicon nitride film.

FIG. 11 is a view showing SIMS (secondary ion mass spectrometry) results of the silicon nitride film, FIG. 12 is a view showing FT-IR results, and FIG. 13 is a view showing the transmittance. FIG. 13 also describes the silicon nitride film formed under the deposition conditions of Table 2. The transmittance is in no way inferior to the conventional PCVD-SiN film.

It is preferable that a silicon nitride film used in the present invention meet the parameter shown in Table 4. That is, it is preferable to meet any one of the following parameters: 1) an etching rate of at most 9 nm (preferably, ranging from 0.5 nm to at most 3.5 nm; 2) hydrogen concentration of at most 1×1021 atoms/cm-3 (preferably, 5×1020 atoms/cm-3); 3) hydrogen concentration of at most 1×1021 atoms/cm-3 (preferably, 5×1020 atoms/cm-3) and oxygen concentration ranging from 5×1018 to 5×1021 atoms/cm-3 (preferably, 1×1019 to 1×1021 atoms/cm-3); 4) an etching rate of at most 9 nm (preferably, ranging from 0.5 nm to at most 3.5 nm) and hydrogen concentration of at most 1×1021 atoms/cm-3 (preferably, 5×1020 atoms/cm-3); and 5) an etching rate of at most 9 nm (preferably, ranging from 0.5 nm to at most 3.5 nm), hydrogen concentration of at most 1×1021 atoms/cm-3 (preferably, 5×1020 atoms/cm-3), and oxygen concentration ranging from 5×1018 to 5×1021 atoms/cm-3 (preferably, 1×1019 to 1×1021 atoms/cm-3).

It is preferable that an absolute value of the internal stress be at most 2×1010 dyn/cm2, more preferably, at most 5×109 dyn/cm2, and more preferably, at most 5×108 dyn/cm2. If the internal stress is reduced, generation of levels at an interface between the silicon nitride film and another film can be reduced. Moreover, peeling-off of a film can be prevented.

A silicon nitride film formed under the deposition conditions described in Table 1 has extreme high blocking effects against Na, Li, and another element belonging to the first or the second group of periodic table, and so the silicon nitride film can prevent effectively the diffusion of these movable ions. For example, a metal film that is aluminum doped with lithium ranging from 0.2 to 1.5 wt % (preferably, 0.5 to 1.0 wt %) is preferable to a cathode of the present invention in terms of a charge injection property, however, there is a threat of damaging an operation of a transistor by the diffusion of lithium. In the present invention, the diffusion of lithium in the direction of a transistor can negligible since the cathode is completely covered by a barrier film.

Figure 14:
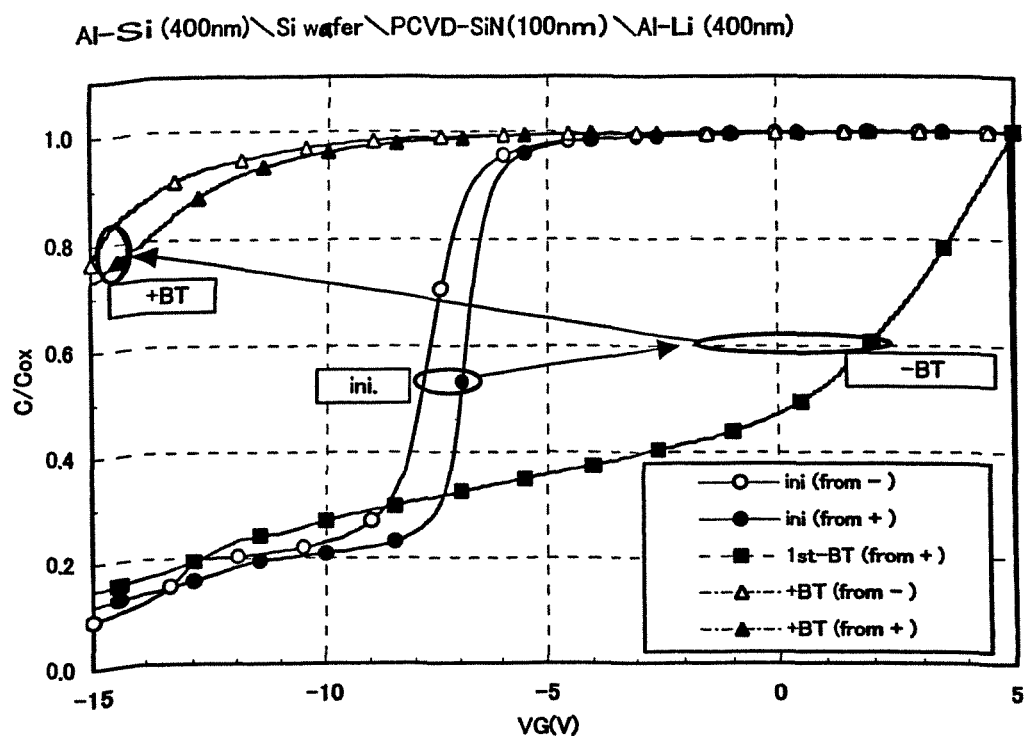
FIG. 14 shows a diagram showing C-V characteristics.
Figure 15:
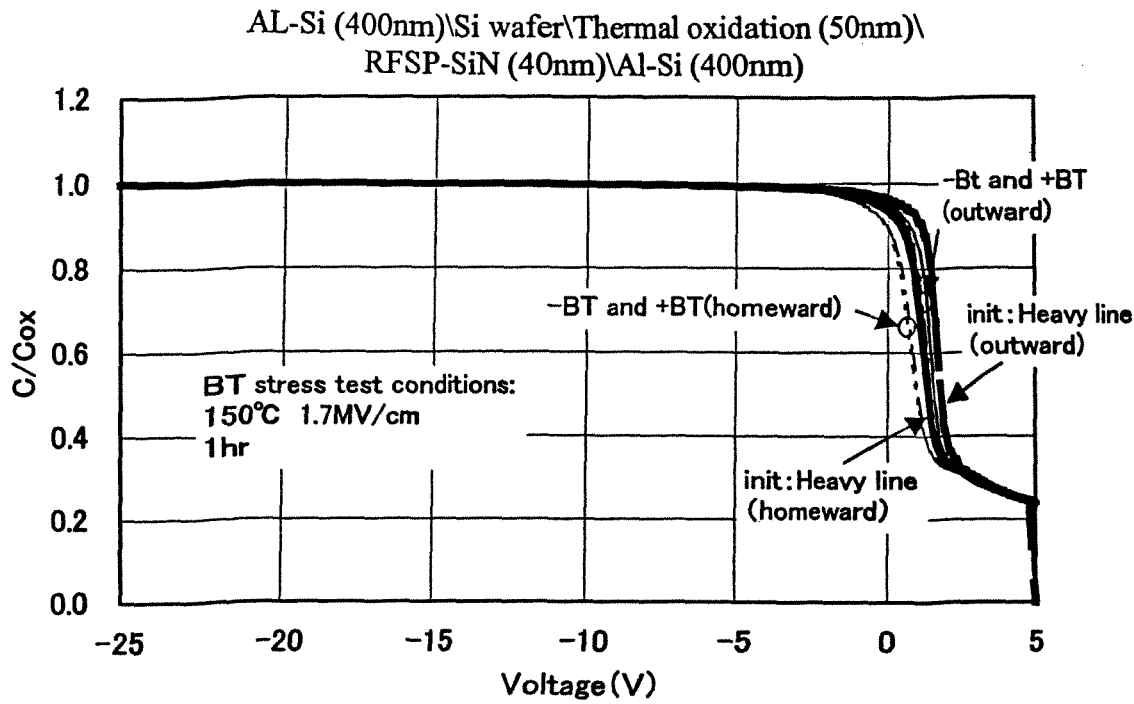
FIGS. 15A-15B shows a diagram showing C-V characteristics.
Figure 15:
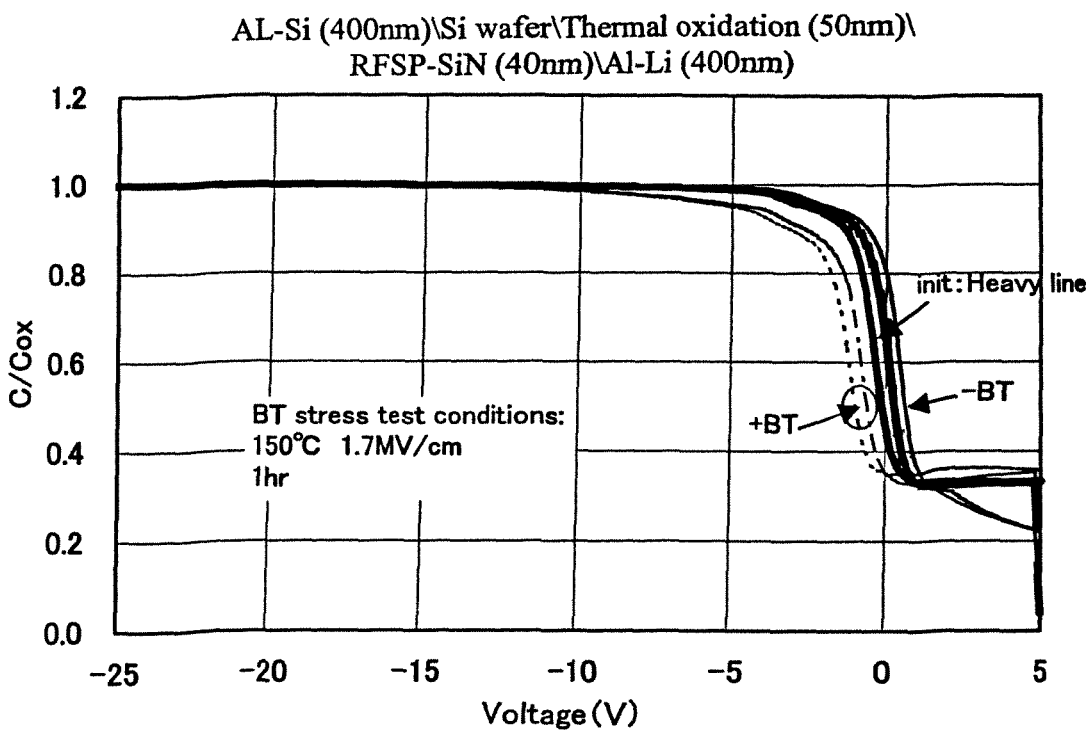
Figure 16:
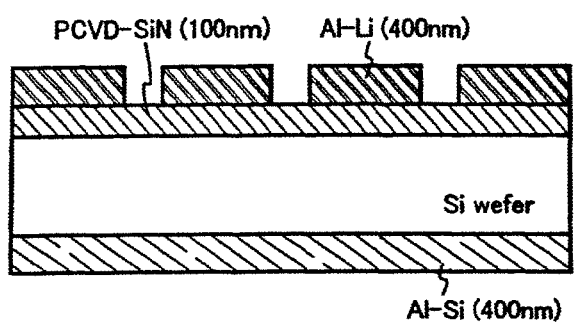
FIGS. 16A-16B shows a cross-sectional view of a silicon nitride film having a MOS structure.
Figure 16:
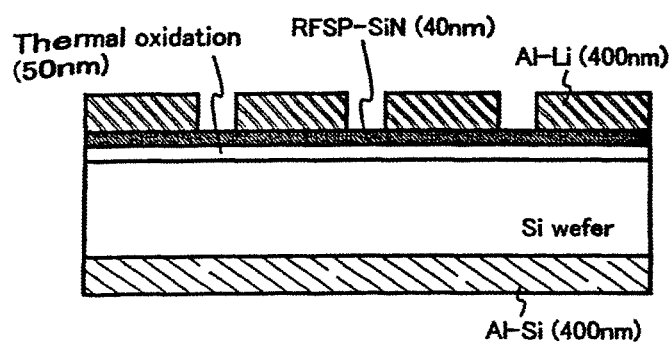

FIGS. 14 to 16 are data of these facts. FIG. 14 is a view showing changes in C-V characteristics during BT stress test of MOS structure using the silicon nitride film (PCVD-SiN film) formed under the deposition conditions shown in Table 2 as dielectric. The structure of a sample is illustrated in FIG. 16A. Effects of the diffusion of lithium can be ascertained by using Al—Li (aluminum doped with lithium) electrode as a surface electrode. According to FIG. 14, the C-V characteristics are varied due to the BT stress test. It can be found that effects of the diffusion from the surface electrode of lithium are obvious by FIG. 14.

By comparing graphs of FIGS. 15A and 15B, there are little changes in C-V characteristics during BT stress test. It is found that there are little effects of diffusion of lithium, that is, the silicon nitride film formed under the deposition conditions of Table 1 functions effectively as a blocking film.

Thus, the silicon nitride film used in the present invention is extreme delicate and has a high blocking property against movable elements such as Na, Li, or the like, and so prevents the diffusion of the degasification components from the flattening film and prevents effectively Li diffusion from Al—Li electrode, or the like. Consequently, high reliable display device can be manufactured. As the reason that the silicon nitride film is delicate, the present inventor guesses that a thin silicon nitride film is formed on the surface of the silicon single crystal target and the silicon nitride film is stacked on a substrate, so that the silicon cluster becomes hardly mixed into the film.

The silicon nitride film can be formed over a resin film as a barrier film since the silicon nitride film is formed by sputtering at the low temperature ranging from the room temperature to 200° C. It is better to use sputtering than plasma CVD in terms that the silicon nitride film can be stacked over the resin film.

Embodiment Mode 2

An example of forming a current source Cs having a structure different from that of Embodiment Mode 1 will be described in this embodiment. The third metal layer is used as an electrode. Another structure is the same as that of Embodiment Mode 1. See Embodiment Mode 1 for explanation of the different structure. Therefore, only different components from that of Embodiment Mode 1 will be explained in this embodiment mode.

Figure 3:
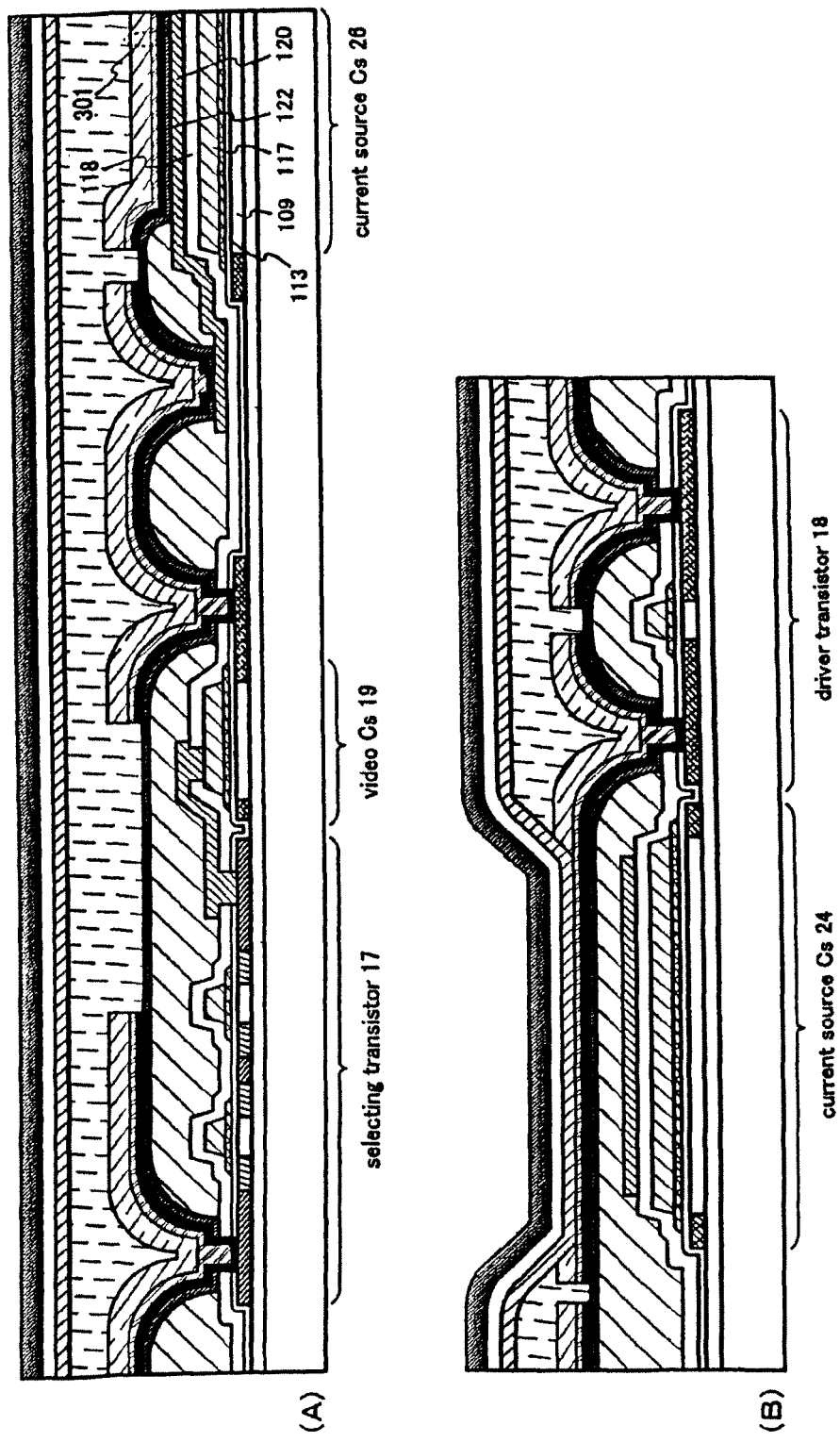
FIGS. 3A-3B shows a cross-sectional view showing a device structure of a display apparatus.

FIGS. 3A and 3B are corresponding to FIGS. 2A and 2B, like components denoted by like numerals as of Embodiment Mode 1 have the same structure explained in Embodiment Mode 1. In this embodiment mode, there is a characteristic in the structure of a current source Cs 26. The flattening film 121 is removed in FIG. 2A. Three capacitor elements are formed into a lamination structure, wherein the first capacitor element composed of the first electrode 109, the dielectric (the gate insulating film 113), and the second electrode 117; the second capacitor element composed of the second electrode 117, the dielectric (the first passivation film 118), and the third electrode 120; and the third capacitor element composed of the third electrode 120, the barrier film 122, and the fourth electrode 301 are stacked.

In this embodiment mode, the first electrode 109 and the third electrode 120 have fixed electrical potential for forming three capacitor elements. Needless to say, the second electrode 117 and the fourth electrode 301 may have fixed electrical potential. That is, it is possible to form capacitor as large as possible by stacking fixed electrical potential electrodes alternately. However, the above-described structure is not exclusive, it can be freely designed which electrode may have fixed electrical potential in the circuit deign process.

Adopting the above-described structure can retain large capacitance with restraining the loss of opening ratio to the minimum since three capacitor elements can be formed with small area. In addition, the structure of the capacitor element described in this embodiment mode can be applied not only to the current source Cs but also the capacitor element required by the video Cs 19 or another pixel.

Embodiment Mode 3

An example of forming a current source Cs formed to have a different structure than that of Embodiment Mode 1 will be described in this embodiment. The third metal layer is used as an electrode. Another structure is the same as that of Embodiment Mode 1. See Embodiment Mode 1 for explanation of the different structure. Therefore, only different components from that of Embodiment Mode 1 will be explained in this embodiment mode.

Figure 4:
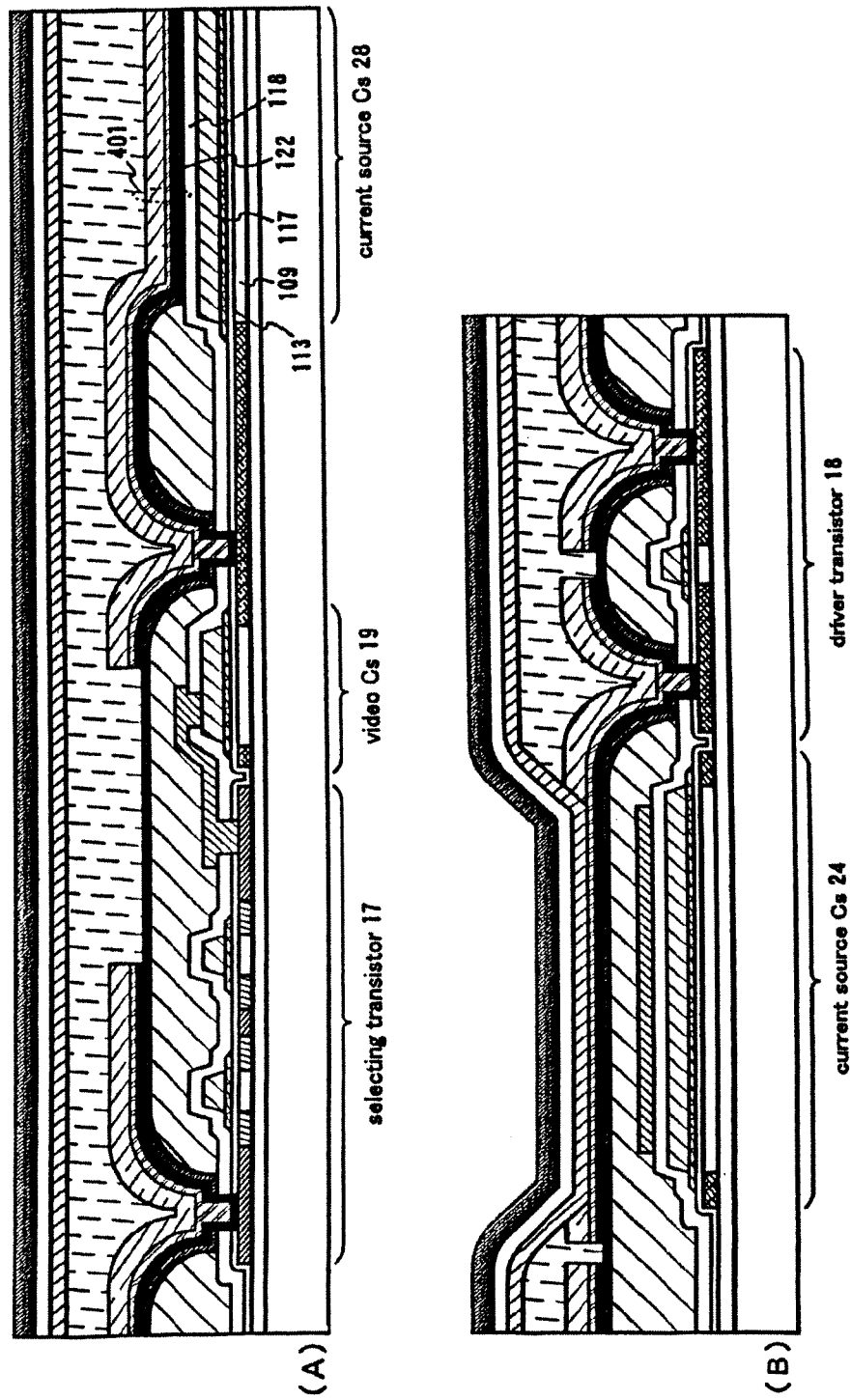
FIGS. 4A-4B shows a cross-sectional view showing a device structure of a display apparatus.

FIGS. 4A and 4B are corresponding to FIGS. 2A and 2B, like components denoted by like numerals as of Embodiment Mode 1 have the same structure explained in Embodiment Mode 1. In this embodiment mode, there is a characteristic in the structure of a current source Cs 28. The flattening film 121 and the third electrode 120 are removed in FIG. 2A. Two capacitor elements are formed into a lamination structure, wherein the first capacitor element is composed of the first electrode 109, the gate insulating film 113, and the second electrode 117; and the second capacitor element is composed of the second electrode 117, the dielectric (a lamination of the first passivation film 118 and the barrier film 122), and the fourth electrode 401 are stacked. In this case, the structure has the advantage of being able to minimize the probability of deterioration due to a pinhole, or the like, since the dielectric is formed into a lamination.

In this embodiment mode, the first electrode 109 and the fourth electrode 401 have fixed electrical potential for forming two capacitor elements. However, the above-described structure is not exclusive, it can be freely decided which electrode may have fixed electrical potential in the circuit deign process.

Adopting the above-described structure can retain large capacitance with restraining the loss of opening ratio to the minimum since two capacitor elements can be formed with small area. In addition, the structure of the capacitor element described in this embodiment mode can be applied not only to the current source Cs but also the capacitor element required by the video Cs 19 or another pixel.

Embodiment Mode 4

An example of forming a current source Cs formed to have a different structure than that of Embodiment Mode 1 will be described in this embodiment. The third metal layer is used as an electrode. Another structure is the same as that of Embodiment Mode 1. See Embodiment Mode 1 for explanation of the different structure. Therefore, only different components from that of Embodiment Mode 1 will be explained in this embodiment mode.

Figure 5:
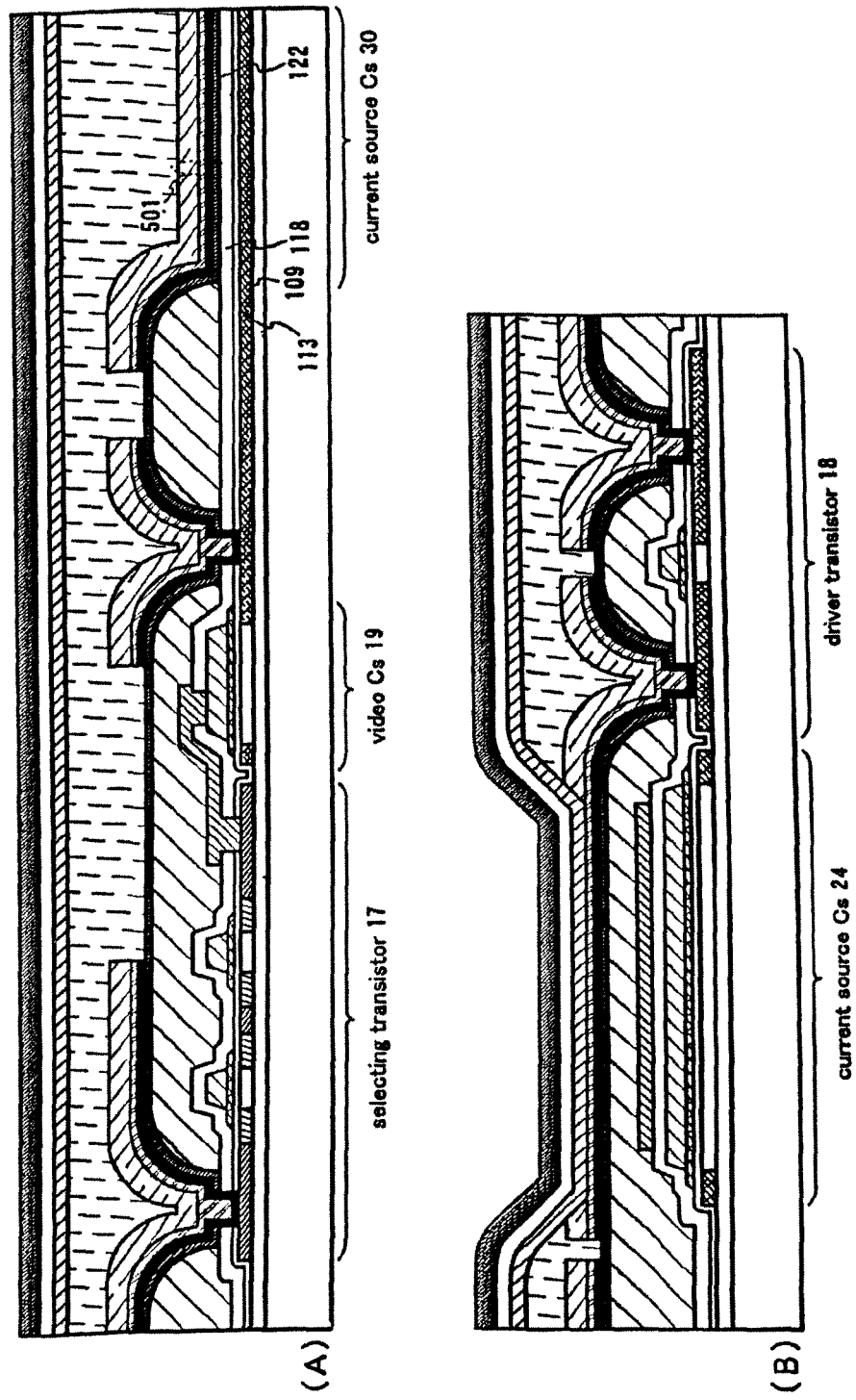
FIGS. 5A-5B shows a cross-sectional view showing a device structure of a display apparatus.

FIGS. 5A and 5B are corresponding to FIGS. 2A and 2B, like components denoted by like numerals as of Embodiment Mode 1 have the same structure explained in Embodiment Mode 1. In this embodiment mode, there is a characteristic in the structure of a current source Cs 30. The flattening film 121, the third electrode 120, and the second electrode 117 are removed in FIG. 5A. The capacitor element comprises the first electrode 109, the dielectric (a lamination of the gate insulating film 113, the first passivation film 118, and the barrier film 122), and the fourth electrode 501. In this embodiment mode, the first electrode 109 has fixed electrical potential. However, the above-described structure is not exclusive, it can be freely designed which electrode may have fixed electrical potential in the circuit deign process. In this case, the structure has the advantage of being able to minimize the probability of deterioration due to a pinhole, or the like, since the dielectric is formed into a lamination of three insulating films.

In this embodiment mode, the first electrode 109, that is, a semiconductor is doped with impurities imparting a conductive type since the second electrode 117 is not presented. Therefore, in the structure shown in FIGS. 1 to 4B, the first electrode 109 cannot be operated as an electrode unless constant voltage is applied to the second electrode 117. However, in case of adopting the structure described in this embodiment mode, the first electrode can be operated as a capacitance without applying constant voltage to the fourth electrode 501. This effect contributes to reduce the power consumption of the display device.

The above-described structure can be applied not only to the current source Cs but also the capacitor element required in the video Cs 19 or another pixel.

Embodiment Mode 5

An example of forming a current source Cs formed to have a different structure than that of Embodiment Mode 1 will be described in this embodiment. The third metal layer is used as an electrode. Another structure is the same as that of Embodiment Mode 1. See Embodiment Mode 1 for explanation of the different structure. Therefore, only different components from that of Embodiment Mode 1 will be explained in this embodiment mode.

Figure 6:
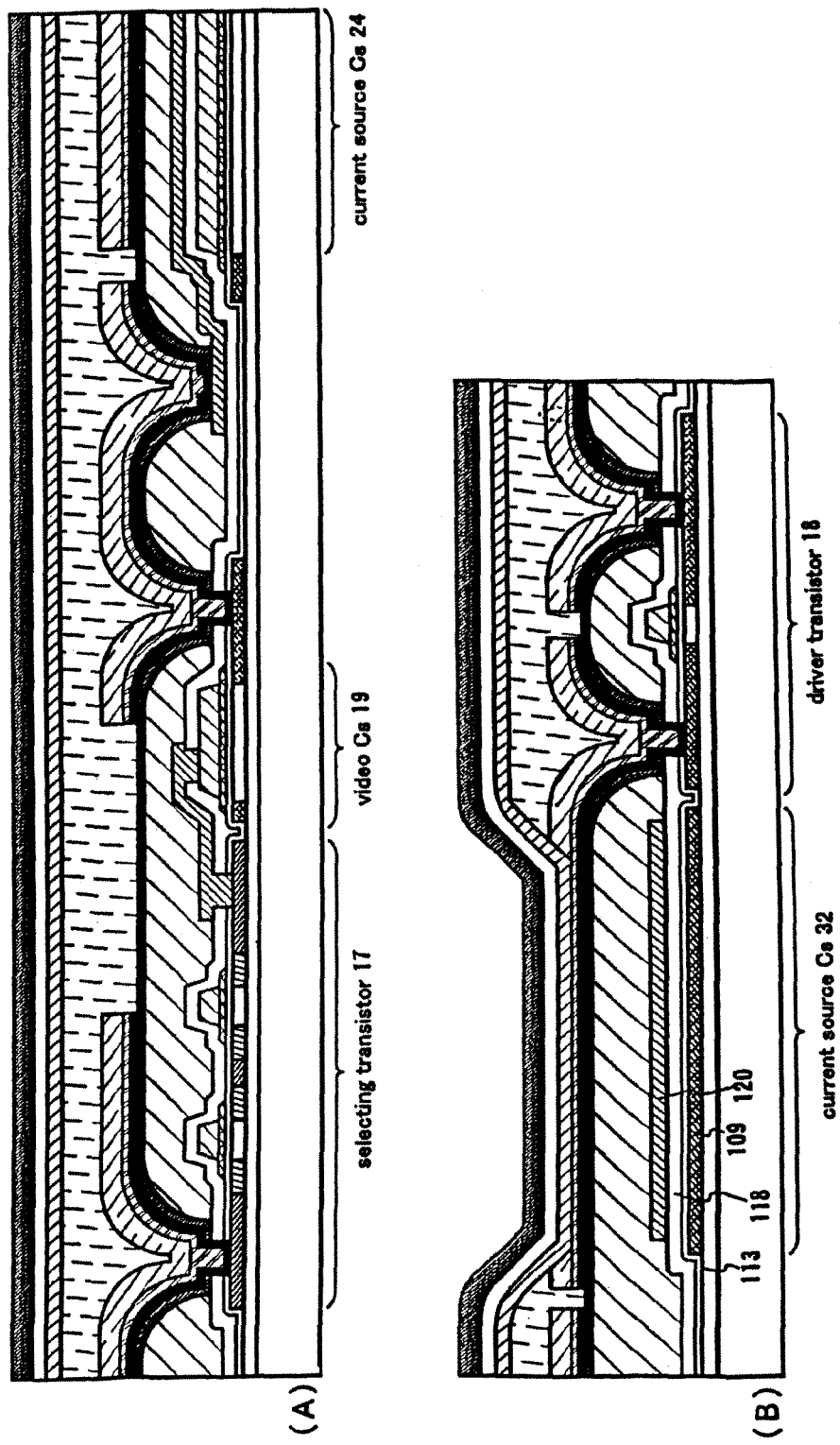
FIGS. 6A-6B shows a cross-sectional view showing a device structure of a display apparatus.

FIGS. 6A and 6B are corresponding to FIGS. 2A and 2B, like components denoted by like numerals as of Embodiment Mode 1 have the same structure explained in Embodiment Mode 1. In this embodiment mode, there is a characteristic in the structure of a current source Cs 32. The second electrode 117 is removed in FIG. 2A. That is, the first electrode 109 can be operated as an electrode without applying constant voltage to the third electrode 120 since the first electrode 109 is doped with impurities. The fact contributes to lower power consumption.

The current source 32 Cs comprises the first electrode 109, the dielectric (a lamination of the gate insulating film 113 and the first passivation film 118), and the third electrode 120. In this case, the structure has the advantage of being able to minimize the probability of deterioration due to a pinhole, or the like, since the dielectric is formed into a lamination. In this embodiment mode, the first electrode 109 has fixed electrical potential. However, the above-described structure is not exclusive, it can be freely decided which electrode may have fixed electrical potential in the circuit deign process.

The above-described structure can be applied not only to the current source Cs but also the capacitor element required in the video Cs 19 or another pixel. In addition, the above-described structure can be implemented by combining any structure in Embodiment Modes 1 to 4.

Embodiment Mode 6

An example of forming a current source Cs formed to have a structure different from that of Embodiment Mode 1 will be described in this embodiment. The third metal layer is used as an electrode. Another structure is the same as that of Embodiment Mode 1. See Embodiment Mode 1 for explanation of the different structure. Therefore, only different components from that of Embodiment Mode 1 will be explained in this embodiment mode.

Figure 7:
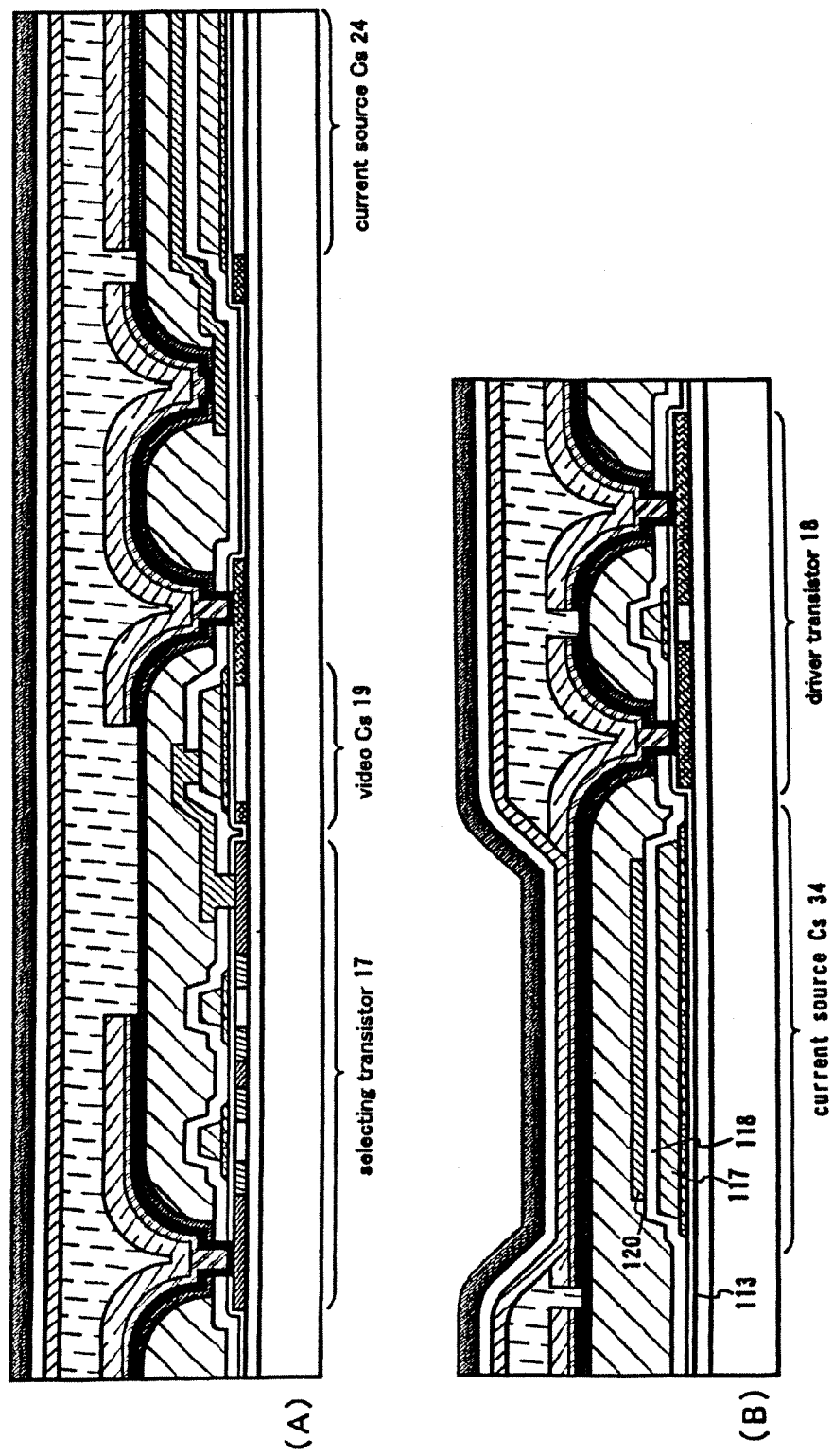
FIGS. 7A-7B shows a cross-sectional view showing a device structure of a display apparatus.

FIGS. 7A and 7B are corresponding to FIGS. 2A and 2B, like components denoted by like numerals as of Embodiment Mode 1 have the same structure explained in Embodiment Mode 1. In this embodiment mode, there is a characteristic in the structure of a current source Cs 34. The first electrode 109 is removed in FIG. 2A.

The current source 34 Cs comprises the second electrode 117, the dielectric (the first passivation film 118), and the third electrode 120. In this embodiment mode, the third electrode 120 has fixed electrical potential. However, the above-described structure is not exclusive, it can be freely decided which electrode may have fixed electrical potential in the circuit deign process.

The above-described structure can be applied not only to the current source Cs but also the capacitor element required in the video Cs 19 or another pixel. In addition, the above-described structure can be implemented by combining any structure in Embodiment Modes 1 to 4.

Embodiment Mode 7

Figure 8:
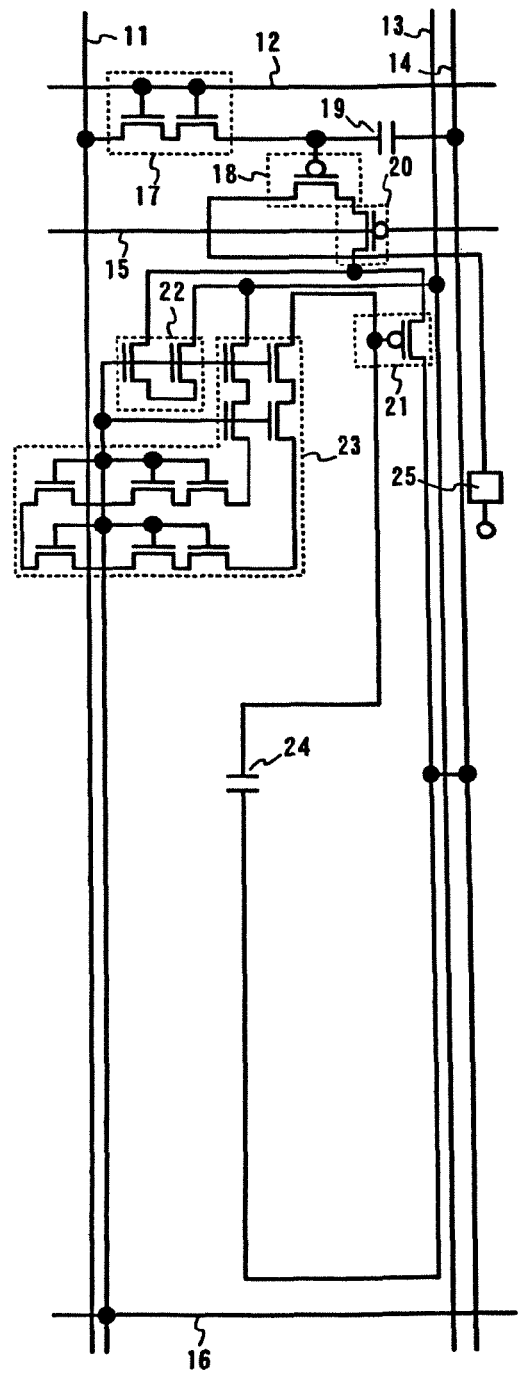
FIG. 8 shows a top surface view and a circuit diagram of a pixel structure of a display apparatus.

An example of a pixel structure, which is different from that shown in Embodiment Mode 1, will be described in this embodiment with reference to FIG. 8. The pixel structure shown in FIG. 8A has the characteristics, that is, all of the selecting line 12, the erase gate line 15, and the current gate line 16 are formed of the same metal layer (the first metal layer); all of the signal line 11, the current line 13, and the power source line 14 are formed of the same metal layer (the second metal layer); and the first metal layer and the second metal layer are crossed each other. In this case, parasitic capacitance is formed since the comparative thin first passivation film 118 is formed between the first metal layer and the second metal layer. However, an opening ratio is improved since the number of contact holes is reduced compared with the structure of Embodiment Mode 1.

In the pixel structure shown in this embodiment mode, any capacitor element having a structure shown in Embodiment Modes 1 to 6 can be formed.

Embodiment Mode 8

All of the structures of the thin film transistor described in Embodiment Modes 1 to 7 become top-gate structures (specifically, planar structures). In each embodiment mode, however, a bottom-gate structure (typically, reverse stagger structure) can be adopted as well. In that case, only the positions of a semiconductor layer serving as an active layer, or the like, and the first metal layer serving as the gate electrode, or the like become reversed. Moreover, the structure can be applied to not only to the thin film transistor but also a MOS structure transistor formed by using silicon, of course.

Embodiment Mode 9

The display devices shown in Embodiment Modes 1 to 8 each exemplifies an electroluminescence display device. However, the device structure itself is common to the case of applying the device structure to a liquid crystal display device and if the structure of the pixel electrode is changed, it can be applied to a liquid crystal display device, a field emission display device, and other display devices having a plurality of pixel.

Embodiment Mode 10

Figure 9:
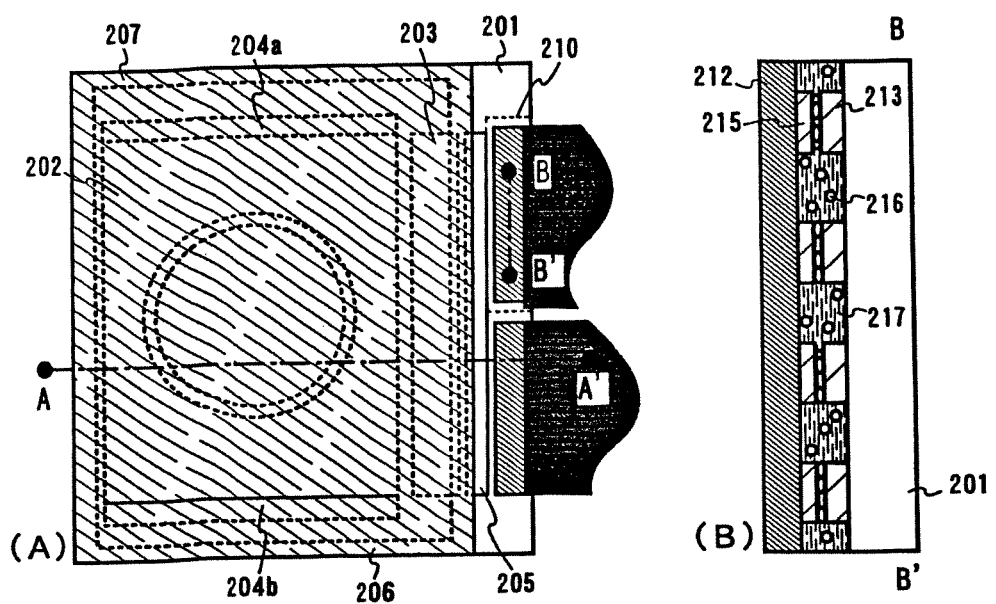
FIGS. 9A-9D shows a top surface view and a circuit diagram of an exterior of a display apparatus.
Figure 9:
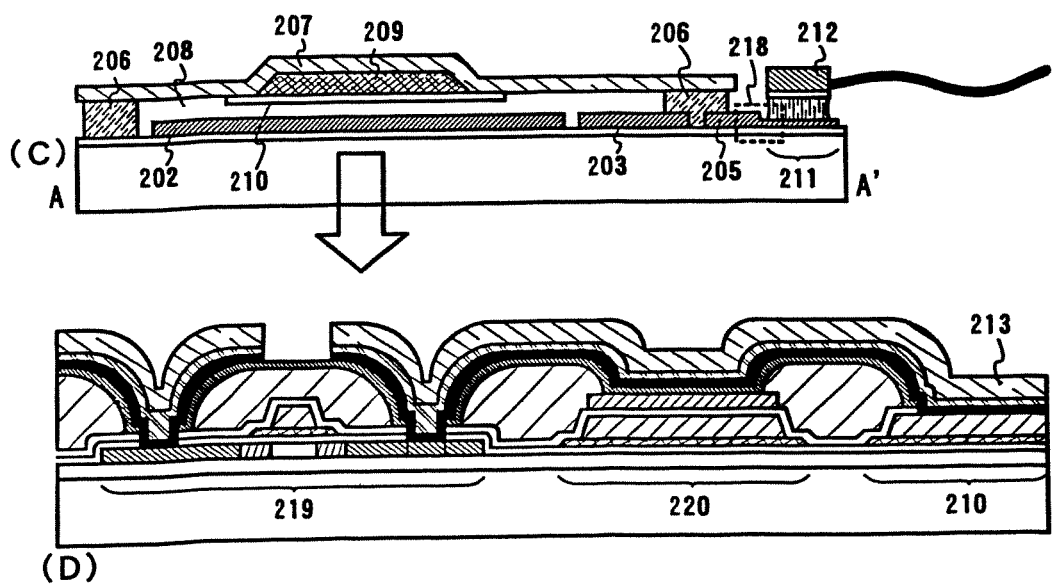

In this embodiment, the structure of an entire electroluminescence display device to which the present invention is applicable will be described with reference to FIGS. 9A to 9D. FIG. 9 is a top view of an electroluminescence display device formed by sealing an element substrate in which thin film transistors are formed with a sealing material. FIG. 9B is a cross-sectional view along a line B-B' in FIG. 9A. FIG. 9C is a cross-sectional view along a line A-A' in FIG. 9A.

A pixel portion (display portion) 202, a data line driver circuit 203 which is provided to encircle the pixel portion 202, gate line driver circuits 204a and 204b, and a protective circuit 205 are all located over a substrate 201. And a seal material 206 is provided to encircle all of these. For the structure of the pixel portion 202, see Embodiment Modes 1 to 8 and these explanations. For forming the seal material 206, a glass material, a metallic material (typically, a stainless material), a ceramic material, or a plastic material (including a plastic film) can be used. As shown in Embodiments 1 to 8, it can be also sealed with only an insulating film.

The seal material 206 may be provided to partially overlap with the data line driver circuit 203, the gate line driver circuits 204a and 204b, and the protective circuit 205. A sealing material 207 is provided using the seal material 206, so that a closed space 208 is formed by the substrate 201, the seal material 206, and the sealing material 207. A hygroscopic agent (barium oxide, calcium oxide, or the like) 209 is provided in advance in a concave portion of the sealing material 207, so that it has a function of absorbing moisture, oxygen, or the like, to keep an atmosphere clean in an inner portion of the above closed space 208, thereby suppressing the deterioration of a luminous body. The concave portion is covered with a cover material 210 with a fine mesh shape. The cover material 210 allows air and moisture to pass therethrough but not the hygroscopic agent 209. Note that the closed space 208 is preferably filled with a noble gas such as nitrogen or argon, and can be also filled with a resin or a liquid if it is inert.

Also, an input terminal portion 211 for transmitting signals to the data line driver circuit 203 and the gate line driver circuits 204a, 204b are provided over the substrate 201. Data signals such as video signals are transferred to the input terminal portion 211 via a FPC (flexible printed circuit) 212. With respect to a cross section of the input terminal portion 211, as shown in FIG. 9B, an input wiring 213 formed together with a gate wiring or a data wiring is electrically connected with a wiring 215 provided in the FPC 212 side through a resin 217 to which conductors 216 are dispersed. Note that a gold or silver coated spherical polymer compound is preferably used for the conductors 216.

Also, an enlarged view of a region 218 surrounded by a dotted line in FIG. 9C is shown in FIG. 9D. The protective circuit 205 is preferably composed by combining a thin film transistor 219 and a capacitor 220, capacitor element having the structure shown in the Embodiment Modes 1 to 7 may be used as the capacitor 220.

In this embodiment, the protective circuit 205 is provided between the input terminal portion 211 and the data line driver circuit 203. When an electrostatic signal such as an unexpected pulse signal is inputted therebetween, the protective circuit carries out its role to release the pulse signal to the outside. At this time, first, a high voltage signal which is instantaneously inputted is dulled by the capacitor 220, and other high voltages can be released to the outside through a circuit composed of a thin film transistor and a thin film diode. Of course, the protective circuit may be provided in other location, for example, a location between the pixel portion 202 and the data line driver circuit 203 or locations between the pixel portion 202 and the gate line driver circuits 204a and 204b.

As described above, according to this embodiment, when the present invention is carried out, an example in which the capacitor used for the protective circuit for electrostatic measures and the like which is provided in the input terminal portion is simultaneously formed is indicated. This embodiment mode can be carried out by being combined with any structure of Embodiment Modes 1 to 9.

Embodiment Mode 11

Examples of electric appliances employing a display device of the present invention to a display portion therein can be given as a video camera, a digital camera, a goggle type display (head mounted display), a navigation system, an audio reproducing apparatus (car audio, an audio component, and the like), a laptop computer, a game machine, a portable information terminal (a mobile computer, a cellular phone, a portable game machine, an electronic book, or the like), and an image reproducing apparatus including a recording medium (specifically, an apparatus capable of processing data in a recording medium such as a Digital Versatile Disk (DVD) and having a display that can display the image of the data). Practical examples of these electric appliances are shown in FIGS. 10A to 10H.

Figure 10:
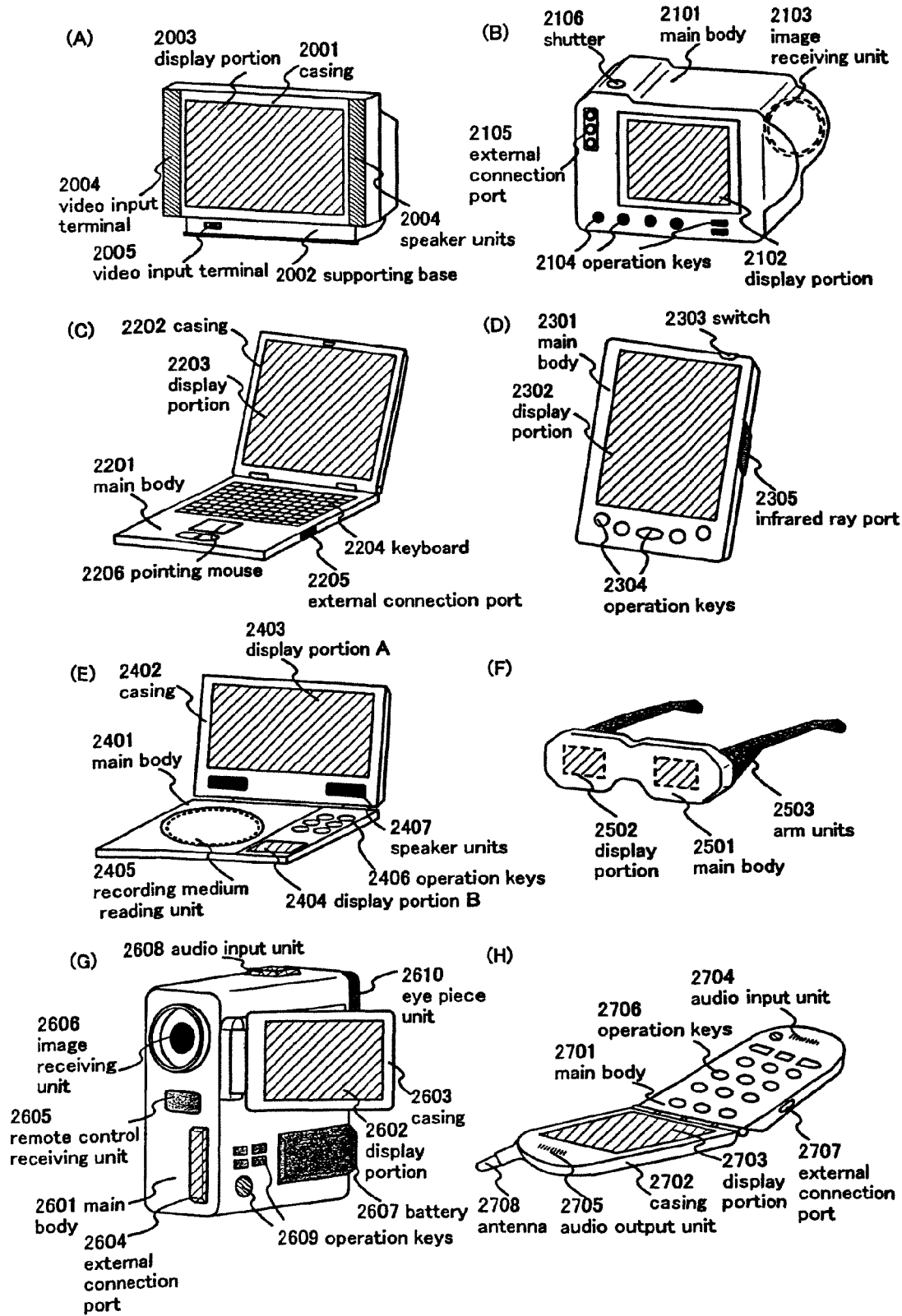
FIGS. 10A-10H shows examples of electric appliances.

FIG. 10A shows a television, which comprises a casing 2001, a supporting base 2002, a display portion 2003, speaker units 2004, a video input terminal 2005, or the like. The present invention is applied to the display portion 2003. The term "television" includes every television for displaying information such as a personal computer, a TV broadcast, and an advertisement.

FIG. 10B shows a digital camera, which comprises a main body 2101, a display portion 2102, an image receiving unit 2103, operation keys 2104, an external connection port 2105, a shutter 2106, or the like. The present invention is applied to the display portion 2102.

FIG. 10C shows a laptop computer, which comprises a main body 2201, a casing 2202, a display portion 2203, a keyboard 2204, an external connection port 2205, a pointing mouse 2206, or the like. The present invention is applied to the display portion 2203.

FIG. 10D shows a mobile computer, which comprises a main body 2301, a display portion 2302, a switch 2303, operation keys 2304, an infrared ray port 2305, or the like. The present invention is applied to the display portion 2302.

FIG. 10E shows a portable image reproducing apparatus equipped with a recording medium (specifically, a DVD player). The apparatus comprises a main body 2401, a casing 2402, a display portion A 2403, a display portion B 2404, a recording medium (DVD, or the like) reading unit 2405, operation keys 2406, speaker units 2407, or the like. The display portion A 2403 mainly displays image information whereas the display portion B 2404 mainly displays text information. The present invention is applied to the display portions A 2403 and B 2404. The term image reproducing apparatus equipped with a recording medium includes domestic game machines.

FIG. 10F shows a goggle type display (head mounted display), which comprises a main body 2501, display portions 2502, and arm units 2503. The present invention is applied to the display portion 2502.

FIG. 10G shows a video camera, which comprises a main body 2601, a display portion 2602, a casing 2603, an external connection port 2604, a remote control receiving unit 2605, an image receiving unit 2606, a battery 2607, an audio input unit 2608, operation keys 2609, an eye piece unit 2610, or the like. The present invention is applied to the display portion 2602.

FIG. 10H shows a cellular phone, which comprises a main body 2701, a casing 2702, a display portion 2703, an audio input unit 2704, an audio output unit 2705, operation keys 2706, an external connection port 2707, an antenna 2708, or the like. The present invention is applied to the display portion 2703. If the display portion 2703 displays white characters on a black background, power consumption of the cellular phone can be reduced.

As described above, the display device obtained by implementing the present invention may be used as the display portions of any electric appliance. The electric appliances shown in this embodiment mode may use any structure of the display device shown in Embodiment Modes 1 to 9.

According to the present invention, firstly, since the flattening film is sealed by the first passivation film or the barrier film, there is no problem of deterioration with time due to degasification of the flattening film and a high reliable display apparatus can be obtained. Secondly, large capacitance value can be retained with small area by forming a capacitor element into a lamination structure. Thirdly, a high luminance electroluminescent display apparatus can be manufactured by improving light extraction efficiency by means of using a pixel electrode having specialized structure into an anode of a light-emitting device, and simultaneously, reliability of a light-emitting apparatus can be improved by preventing the deterioration of the light-emitting device by means of lowering power consumption.

Therefore, the display apparatus according to the present invention can retain sufficient large capacitance values (capacitance values for retaining charges) required by each pixel by utilizing multiple wirings. And, a high reliable and high luminance display apparatus can be manufactured by forming a structure capable of preventing deteriorations of a light-emitting device as much as possible.

What is claimed is:

1. A display device comprising:
a first semiconductor;
a second semiconductor;
a third semiconductor, wherein the first semiconductor, the second semiconductor, and the third semiconductor are over and in contact with an insulating surface;
a gate insulating film over the first semiconductor, the second semiconductor, and the third semiconductor;
a first metal layer over the gate insulating film and the first semiconductor;
a first passivation film over the first metal layer, the second semiconductor, and the third semiconductor;
a second metal layer over the first passivation film and the third semiconductor;
a flattening film over the second metal layer and the first passivation film;
a barrier film over the flattening film;
a third metal layer over the barrier film and the first semiconductor; and
a forth metal layer over the barrier film and the second semiconductor,
wherein a first opening is in the flattening film and a side face of the first opening is covered by the barrier film,
wherein a second opening in a lamination is inside the first opening, the lamination having the gate insulating film, the first passivation film, and the barrier film, and
wherein the third metal layer is connected to the first semiconductor via the first opening and the second opening, and
the display device comprising:
a capacitor element comprising the second semiconductor, the gate insulating film, the first passivation film, the barrier film in contact with the first passivation film, and a fourth metal layer,
and
wherein the third metal layer and the fourth metal layer are in contact with the barrier film.

2. A display device according to claim 1, wherein the first semiconductor is over a substrate.

3. A display device according to claim 2, wherein the substrate is a glass substrate.

4. A display device according to claim 1, wherein the first metal layer comprises a tantalum nitride film and a tungsten film.

5. A display device according to claim 1, wherein the second metal layer comprises an second semiconductor aluminum film or a thin copper film.

6. A display device according to claim 1, wherein the third metal layer comprises a titanium film, a titanium nitride film, and an aluminum film.

7. A display device according to claim 1, wherein the barrier film comprises a silicon nitride film having an etching rate of at most 9 nm/min.

8. A display device according to claim 1, wherein the barrier film comprises a silicon nitride film having hydrogen concentration of at most $1 \times 10^{21}$ cm$^{-3}$.

9. A display device according to claim 1, wherein the flattening film is an organic resin film or an SOG film.

10. A display device according to claim 1, wherein an end portion of the barrier film and an end portion of the first passivation film are in contact with each other.

11. A display device according to claim 1, wherein the second metal layer is isolated from the third semiconductor.

12. A display device according to claim 1, wherein a pixel electrode is over the second metal layer, and
wherein the pixel electrode is electrically connected to the first semiconductor.

13. A display device according to claim 1, wherein each of the first semiconductor, the second semiconductor, and the third semiconductor comprises polysilicon.

14. A display device comprising:
a first semiconductor;
a second semiconductor;
a third semiconductor, wherein the first semiconductor, the second semiconductor, and the third semiconductor are over and in contact with an insulating surface;
a gate insulating film over the first semiconductor, the second semiconductor and the third semiconductor;
a first metal layer over the gate insulating film and the first semiconductor;
a first passivation film over the metal layer, the second semiconductor, and the third semiconductor;
a second metal layer over the first passivation film and the third semiconductor;
a flattening film over the second metal layer and the first passivation film;
a barrier film over the flattening film;
a third metal layer over the barrier film and the first semiconductor; and
a forth metal layer over the barrier film and the second semiconductor,
wherein a first opening is in the flattening film and a side face of the first opening is covered by the barrier film,
wherein a second opening in a lamination is inside the first opening, the lamination having the gate insulating film, the first passivation film, and the barrier film, and
wherein the third metal layer is connected to the first semiconductor via the first opening and the second opening, and
the display device comprising:
a capacitor element comprising the second semiconductor, the gate insulating film, the first passivation film, the barrier film in contact with the first passivation film, and a fourth metal layer,
wherein the third metal layer and the fourth metal layer are in contact with the barrier film,
wherein each of the first semiconductor, the second semiconductor and the third semiconductor comprises a source region, a drain region, and a channel forming region.

15. A display device according to claim 14, wherein the first semiconductor is over a substrate.

16. A display device according to claim 15, wherein the substrate is a glass substrate.

17. A display device according to claim 14, wherein the first metal layer comprises a tantalum nitride film and a tungsten film.

18. A display device according to claim 14, wherein the second metal layer comprises an aluminum film or a thin copper film.

19. A display device according to claim 14, wherein the third metal layer comprises a titanium film, a titanium nitride film, and an aluminum film.

20. A display device according to claim 14, wherein the barrier film comprises a silicon nitride film having an etching rate of at most 9 nm/min.

21. A display device according to claim 14, wherein the barrier film comprises a silicon nitride film having hydrogen concentration of at most $1\times10^{21}$ cm$^{-3}$.

22. A display device according to claim 14, wherein the capacitor element comprises the second metal layer over the first passivation film.

23. An electronic device comprising:
a display device, the display device comprising:
   a first semiconductor;
   a second semiconductor;
   a third semiconductor, wherein the first semiconductor, the second semiconductor, and the third semiconductor are over and in contact with an insulating surface;
   a gate insulating film over the first semiconductor, the second semiconductor and the third semiconductor;
   a first metal layer over the gate insulating film and the first semiconductor;
   a first passivation film over the first metal layer, the second semiconductor, and the third semiconductor;
   a second metal layer over the first passivation film and the third semiconductor;
   a flattening film over the second metal layer and the first passivation film;
   a barrier film over the flattening film;
   a third metal layer over the barrier film and the first semiconductor; and
   a forth metal layer over the barrier film and the second semiconductor,
   wherein a first opening is in the flattening film and a side face of the first opening is covered by the barrier film,
   wherein a second opening in a lamination is inside the first opening, the lamination having the gate insulating film, the first passivation film, and the barrier film, and
   wherein the third metal layer is connected to the first semiconductor via the first opening and the second opening, and
the display device comprising:
   a capacitor element comprising the second semiconductor, the gate insulating film, the first passivation film, the barrier film in contact with the first passivation film, and a fourth metal layer,
and
wherein the third metal layer and the fourth metal layer are in contact with the barrier film.

* * * * *